(12) United States Patent
Ohgiyama

(10) Patent No.: US 6,215,179 B1
(45) Date of Patent: Apr. 10, 2001

(54) SEMICONDUCTOR DEVICE

(75) Inventor: Kenji Ohgiyama, Isahaya (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/252,817

(22) Filed: Feb. 19, 1999

(30) Foreign Application Priority Data

Jul. 2, 1998 (JP) .................................................. 10-187356

(51) Int. Cl.$^7$ .................................................. H01L 23/495
(52) U.S. Cl. .......................... 257/676; 257/723; 257/737; 257/778
(58) Field of Search .................................... 257/711, 676, 257/778, 666, 737, 723

(56) References Cited

U.S. PATENT DOCUMENTS 5,188,985 * 2/1993 Medeiros, III et al. .............. 257/711

FOREIGN PATENT DOCUMENTS

| 3-94459 | 4/1991 | (JP) . |
| 8-115991 | 5/1996 | (JP) . |

* cited by examiner

*Primary Examiner*—Carl Whitehead, Jr.
*Assistant Examiner*—Roy Potter
(74) *Attorney, Agent, or Firm*—Oblon, Spivak, McClelland, Maier & Neustadt, P.C.

(57) ABSTRACT

A semiconductor device which includes a semiconductor chip mounted on a die pad having first and second surfaces opposite to each other with the semiconductor chip mounted on the first surface, and one or a plurality of electrode terminals having third and fourth surfaces opposite to each other and spaced a distance from the die pad and electrically connected with the semiconductor chip through a corresponding wire with the wire being connected to the third surface. Further, a sealing resin encloses the die pad and the electrode terminal. A surface of the die pad opposite to the surface on which the second and fourth surfaces of the die pad and the electrode terminal, respectively, is exposed to an outside of the sealing resin.

17 Claims, 31 Drawing Sheets

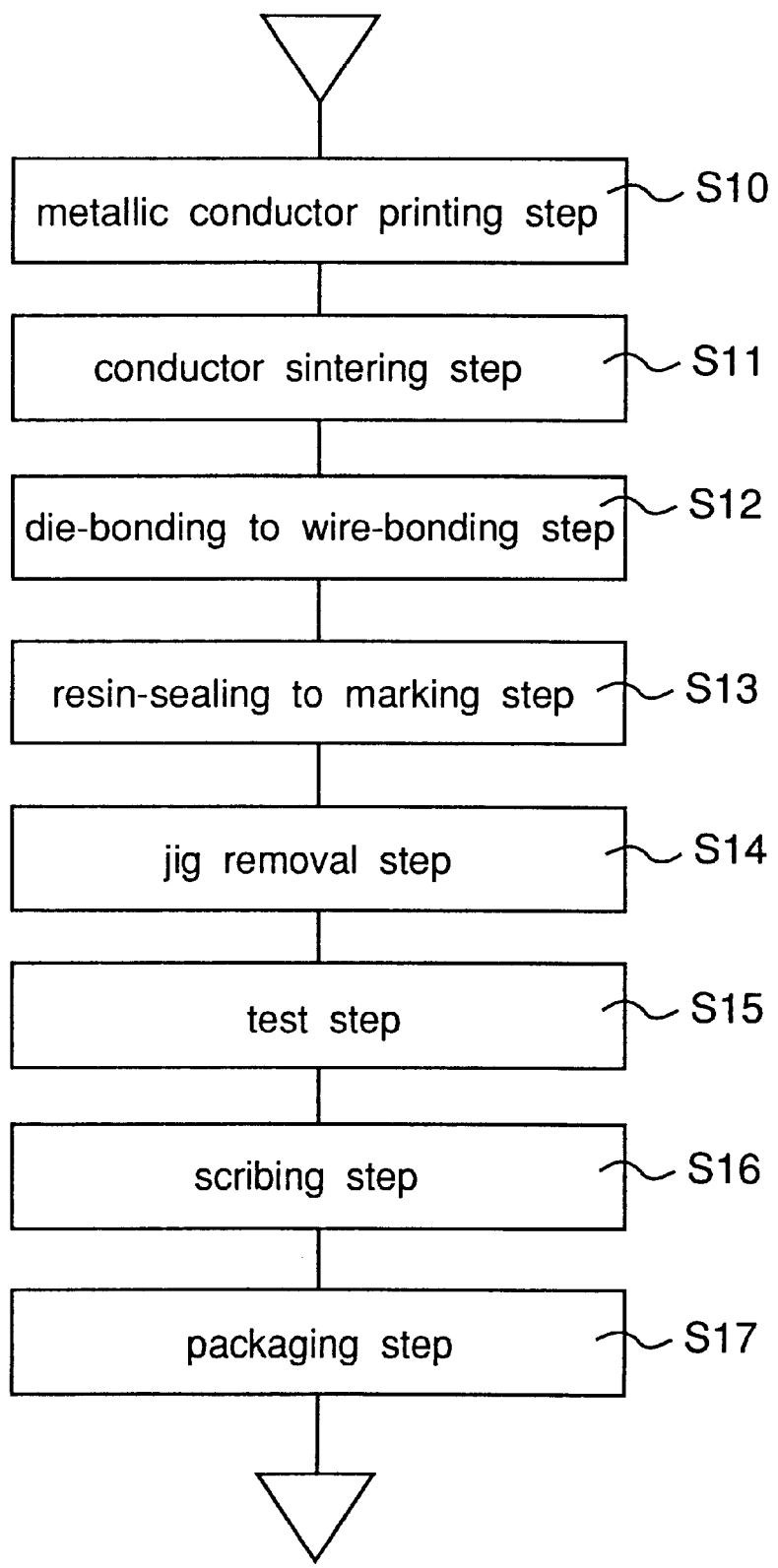

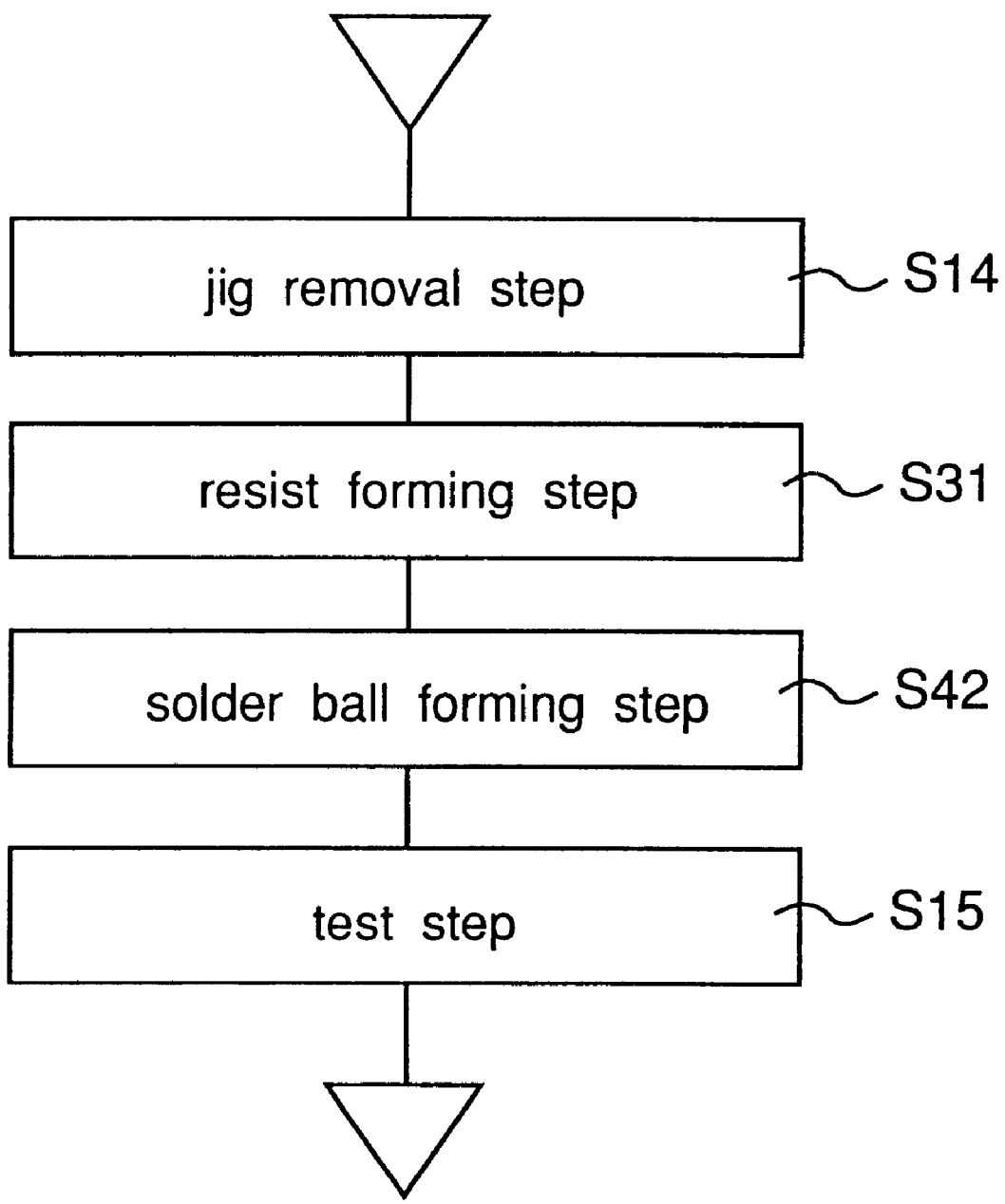

SEMICONDUCTOR DEVICE

BACKGROUND OF THE INVENTION

1. Field of the Invention

The present invention relates to a semiconductor device having a semiconductor chip and electrode terminals molded together with a sealing resin and a method of manufacturing the same.

2. Description of the Prior Art

The semiconductor device of conventional design will be discussed with reference to FIGS. 30A to 32. The semiconductor device 50a shown in FIG. 30A is disclosed in the Japanese Laid-open Patent Publication No. 3-94459 and is of a structure wherein a semiconductor chip 3 is mounted on a die pad 51, and wire pads 52 are spaced from the die pad 51 and connected with the semiconductor chip 3 through respective wires 4, both of said pads 51 and 52 being sealed by a synthetic resin 5. More specifically, the semiconductor chip 3 is bonded to the die pad 51 by means of a die bond material 2, and bump 53 are added to the wire pads 52.

The semiconductor device 50a disclosed in the publication No. 3-94459 is manufactured in the following processes. In the first place, as shown in FIGS. 31A and 31B, semiconductor chips are mounted on a metallic base substrate provided with die pads and wire pads and manufactured in a manner as shown by the flowchart of FIG. 32. This is followed by connection of the semiconductor chips with the wire pads with wires made from gold or other materials. Then, the semiconductor chips and the chip carrying surface of the metallic base substrate are sealed by a resinous materials. By doing so, the semiconductor devices are formed on the metallic base substrate 60 as shown in FIGS. 31A and 31B. Then a portion of the metallic base substrate 60 other than areas where the semiconductor devices have been formed is subsequently removed by etching to thereby complete fabrication of the individual semiconductor devices 50a.

The publication No. 3-94459 discloses an alternative method which comprises preparing a transfer film including a base film and a metallic layer of, for example, copper formed on the base film through a peel-off layer intervening therebetween, bonding semiconductor chips to the transfer film by the use of a die bonding material, connecting the semiconductor chips with the metallic layer by resin, through wires such as gold wires, sealing the semiconductor chips and a chip carrying surface of the metallic layer, and removing the base film by etching or peeling to thereby complete the individual semiconductor devices with each having both die and wire pads.

According to the publication No. 3-94459, in view of the fact that during the manufacture the metallic base substrate 60 or the base film is etched off, the metallic base substrate 60 or the base film cannot be reused, resulting in an increase in the cost of manufacture. Also, the etching process requires a relatively long processing time and a relatively high processing cost resulting in lower production levels. In addition, the etching process requires the use of an alkaline solvent and, a flushing of water, accompanied by lowering of the bondability between the sealing resin 5 and the external electrodes 35. This turn brings about reduction in reliability of the semiconductor device.

Even using the method in which the base film is peeled off, the base film is damaged or otherwise deformed and, therefore, no reuse is possible with the transfer film once used, resulting in an increase in the cost of manufacturing.

Moreover, a minute uneven surface of 1 to 2 $\mu$m of an electrolyte copper foil which is the metallic layer on the base film tends to constitute a cause of reduction in bondability between the metallic layer and the sealing resin 5 by an anchoring effect, resulting in reduction in reliability of the semiconductor device.

Furthermore, in the prior method of manufacturing semiconductor, since each of the semiconductor devices 50a are sealed to the metallic base substrate 60, the metallic base substrate 60 needs a proper space 60 between the neighboring semiconductor devices 50a, therefore, the number of the semiconductor devices 50a that can be manufactured on a given surface area of the metallic base substrate 60 is limited, thereby posing a problem associated with productivity.

Another prior art semiconductor device 50b shown in FIG. 30B is fabricated according to a method disclosed in, for example, the Japanese Laid-open Patent Publication No. 8-115991. The semiconductor device 50b includes a semiconductor chip 3 mounted on a lead frame having inner layers 33, 34a and 34b formed of materials such as nickel by the use of a evaporation technique or a plating technique utilizing a metal masking aperture and having a cladding 36 of a solder plating. More specifically, the semiconductor chip 3 is sealed at one side thereof by a resinous material 5. The portion of the lead frame where no sealing resin is deposited, and other than an area where external electrodes 35 are formed, is covered by a solder resist 38.

The publication No. 8-115991 also discloses the lead frame provided with a cladding 36 of solder plating formed by press work.

According to the publication No. 8-115991, in the step of manufacturing semiconductor 50b, the formation of the inner layers 33, 34a and 34b of, for example, nickel, and the solder plated cladding 36 by the use of the evaporation technique or the plating technique utilizing the metal masking aperture requires a relatively long time, bringing about the problem of a reduction in productivity. Also, the formation of the lead frame by the use of press work requires the use of an expensive mold for each of the eventually fabricated semiconductor devices.

SUMMARY OF THE INVENTION

Therefore, the present invention has been devised to substantially eliminate the above discussed problems inherent in the prior art semiconductor devices. The present invention provides a method of manufacturing a semiconductor with high productivity at a minimized cost and also to provide a reliable semiconductor device manufactured according to such method.

In order to solve the problems, the present invention provides a semiconductor device which includes a semiconductor chip mounted on a die pad, the die pad having first and second surfaces opposite to each other, and the semiconductor chip being mounted on the first surface, at least one electrode terminal spaced a distance from the die pad and electrically connected with the semiconductor chip through a corresponding wire, with the electrode terminal having third and fourth surfaces opposite to each other, and the wire being connected to the third surface, and a sealing resin enclosing the die pad and the electrode terminal, with a surface of the die pad opposite to the surface on which the second and fourth surfaces of the die pad and the electrode terminal, respectively, being exposed to an outside of the sealing resin; the die pad and the electrode terminal being formed of a sintered metal formed by sintering a paste containing a metal powder.

The die pads being formed of the sintered metal is effectively increases the bondability among the die pads, the wire pad, and the sealing resin, resulting in increase of the reliability of the semiconductor device.

The fourth surface of the electrode terminal is preferably formed with an electroconductive protrusion.

The electroconductive protrusion of the electrode terminal is effective to increase the connection between the semiconductor device and outside device.

Preferably, at least a portion of the second surface of the die pad may be formed with an electroconductive protrusion.

The electroconductive protrusion of the die pad effectively increases the efficiency of radiation of heat in the semiconductor device.

If desired, the die pad may be made of a plurality of sintered, wherein the semiconductor chip is mounted on the plural sintered metals.

The semiconductor chip mounted on the plural sintered metals is effective to increase the reliability of the semiconductor device.

Preferably the protrusion may be a solder ball.

The solder ball is effective to increase connecting the semiconductor device and outside device.

The semiconductor device referred to above may be comprised of a protective layer formed so as to continuously cover a portion of the second surface of the die pad and a portion of the fourth surface of the electrode terminal or the second surface of the die pad adjacent the die pad to thereby prevent a moisture component from entering in the sealing resin.

The resist layer in the semiconductor device effectively prevents moisture from entering the interface between the sealing resin.

If desired, the number of semiconductor chips is plural and the number of die pads is correspondingly plural, both of the plural semiconductor chips and the correspondingly plural die pads being integrated together by the sealing resin.

The plural semiconductor chips and the correspondingly die pads being integrated together by the sealing resin effectively increases the integration level of the semiconductor device.

The present invention provides a method of fabricating a semiconductor device which is comprised of a semiconductor chip mounted on a die pad, the die pad having first and second surfaces opposite to each other, the semiconductor chip being mounted on the first surface. The device has one or a plurality of electrode terminals spaced a distance from the die pad and is electrically connected with the semiconductor chip through a corresponding wire, the electrode terminal having third and fourth surfaces opposite to each other. The wire is connected to the third surface, and a sealing resin encloses the die pad and the electrode terminal, a surface of the die pad opposite to the surface on which the second and fourth surfaces of the die pad and the electrode terminal, respectively, are exposed to the outside of the sealing resin, the method includes a pattern forming step of forming metallic paste layers on a reusable planar jig in respective patterns corresponding to the plural die pads and the plural electrode terminals. There is also a sintering step of sintering the metallic paste layers on the planar jig to form a plurality of die pads and a plurality of electrode terminals. In addition, there is a connecting step of placing semiconductor chips on the die pads and connecting the semiconductor chips with the electrode terminals through wires to thereby form a plurality of unitary members each comprised of the semiconductor chip and the electrode terminals connected therewith through the wires, and a jig removal step of sealing the unitary members on the planar jig with a sealing resin to form a semiconductor device member which is subsequently separated from the planar jig.

The use of a reusable planar jig is effective for fabricating the semiconductor at a minimized cost.

The method referred to above may include a scribing step of separating the semiconductor device member to provide a secondary member in which one unitary member is covered by a resinous material.

The scribing step to provide the secondary member is effective for high productivity in fabricating the semiconductor.

Preferably the method referred to above comprises a scribing step of separating the semiconductor device member to provide a secondary member in which a predetermined number of the unitary members are covered by a resinous material.

The scribing step to provide the secondary member having predetermined number of the unitary members is effective for high productivity in fabricating the semiconductor.

If desired the pattern forming utilizing a screen printing technique in which a mask having apertures corresponding to the die pads and the electrode terminals are formed may carry out step.

Utilizing the screen printing is an effective method to change the design for the die pads and the electrode terminals easily.

BRIEF DESCRIPTION OF THE DRAWINGS

The present invention will be readily understood from the following description of preferred embodiments thereof made with reference to the accompanying drawings, in which like parts are designated by like reference numeral and in which:

FIG. 2 is a flowchart showing a method of fabricating the semiconductor device according to the first embodiment of the present invention;

FIG. 19 is a flowchart showing the method of fabricating the semiconductor device according to a modification of the second embodiment of the present invention;

DETAILED DESCRIPTION OF THE EMBODIMENTS

First Embodiment

Figure 1A:
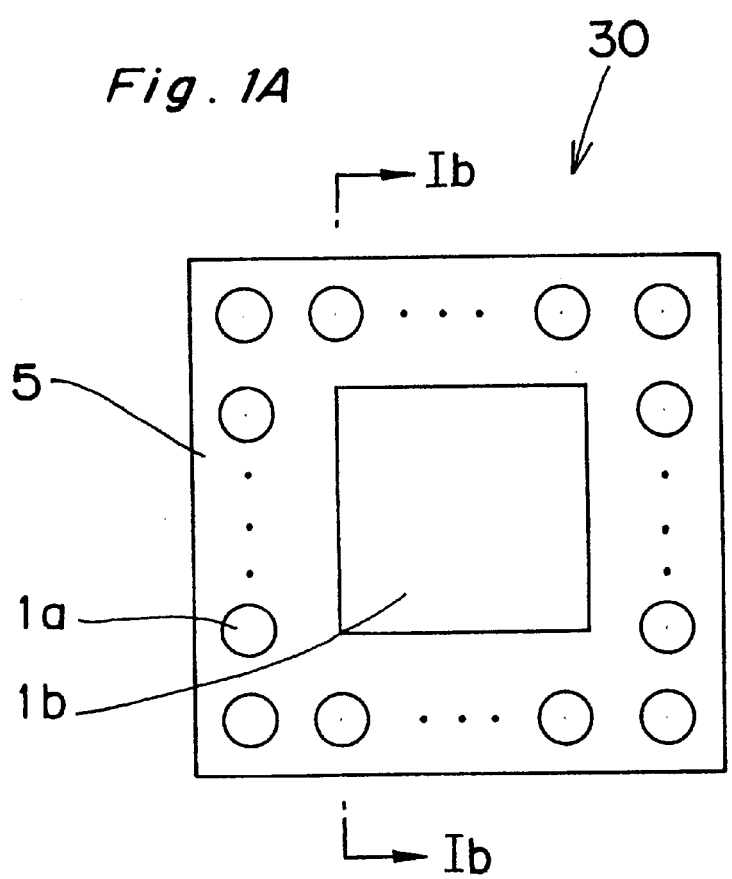
FIG. 1A is a bottom plan view of a semiconductor device according to a first embodiment of the present invention.
Figure 1B:
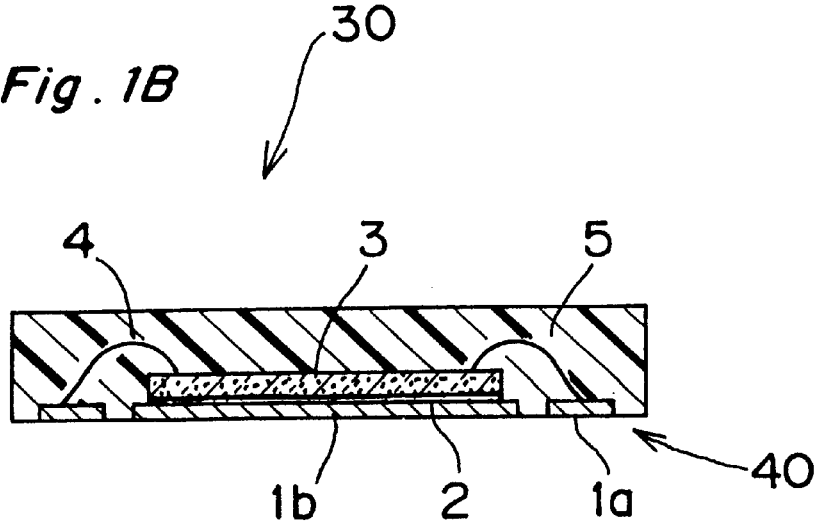
FIG. 1B is a cross-sectional view taken along the line Ib—Ib in FIG. 1A.

Referring first to FIGS. 1A and 1B, a semiconductor device 30 according to a first embodiment of the present invention is of a structure wherein a semiconductor chip 3, mounted on a die pad 1b of sintered metal, and wire pads 1a of sintered metal connected with the semiconductor chip 3 through wires 4 and serving as external electrodes are covered by a sealing resin 5. The semiconductor device 30 has a surface 40 not covered by the sealing resin 5. Through the surface 40 the semiconductor device 30 is electrically connected with an external device such as, for example, a motherboard. More specifically, the wire pads 1a are arranged so as to surround the die pad 1b, and are sealed by a sealing resin 5 together with the semiconductor chip 3 that respective surfaces of the wire pads 1a opposite to the surfaces to which the wires 4 are connected and one surface of the die pad 1b opposite to the surface on which the semiconductor chip 3 is mounted can be exposed to the outside of the sealing resin 5 through an external contact surface 40. It is to be noted that the semiconductor chip 3 is bonded to the die pad 1b by means of a layer of a die bond material 2.

The manner by which the semiconductor device 30 is fabricated will now be described with reference to the flowchart of FIG. 2.

Figure 3A:
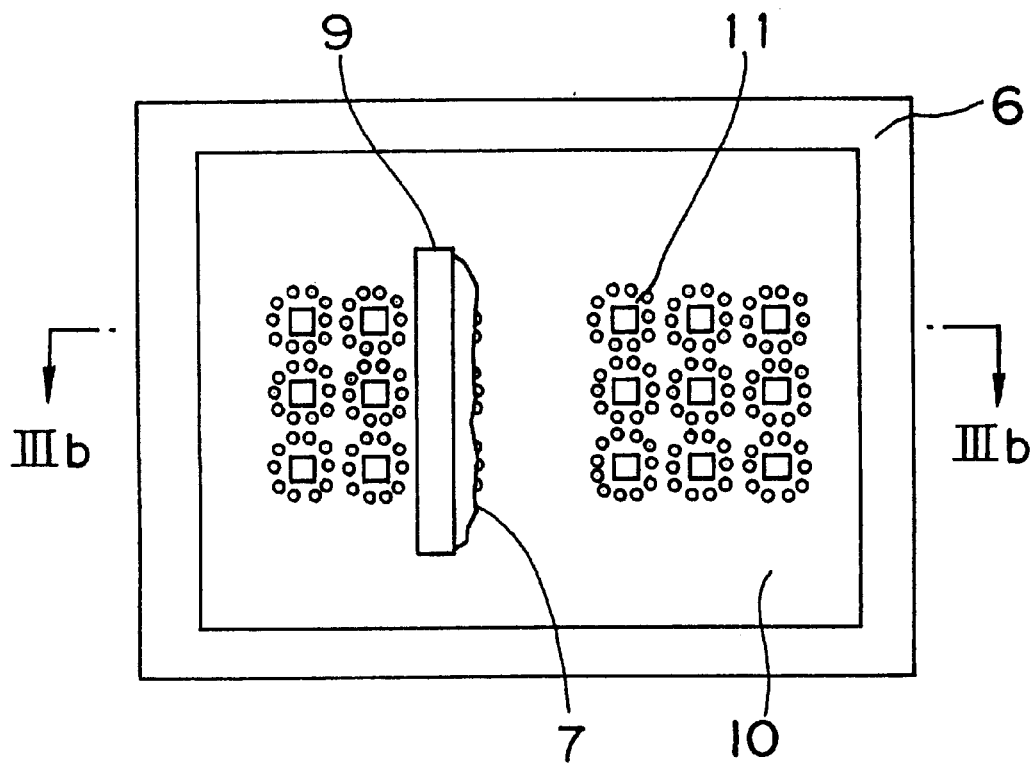
FIG. 3A is a top plan view illustrating a printing step to form a metal conductor in the flowchart of FIG. 2.
Figure 3B:
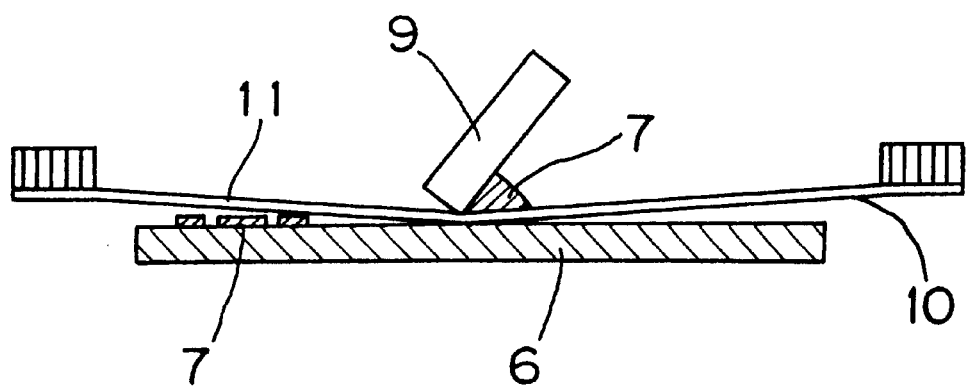
FIG. 3B is a cross-sectional view taken along the line IIIb—IIIb in FIG. 3A.

Referring now to FIG. 2, during a metal conductor printing step S10, metallic paste layers 7 are formed in a predetermined or desired pattern on a metallic planar jig 6 as shown in FIGS. 3A and 3B. To form the patterned metallic paste layers 7, a screen printing technique may be employed such as shown in FIGS. 3A and 3B. As shown therein, the planar jig 6 is positioned underneath a printing mask 10 having a pattern of a multiplicity of apertures 11, and a printing squeegee 9 is moved over the printing mask 10 to allow a metallic paste, which contains a powder of silver and is applied over the printing mask 10 as shown in FIG. 3A, to penetrate through perforations 11 to eventually deposit on the planar jig 6 as shown in FIG. 3B.

Figure 4A:
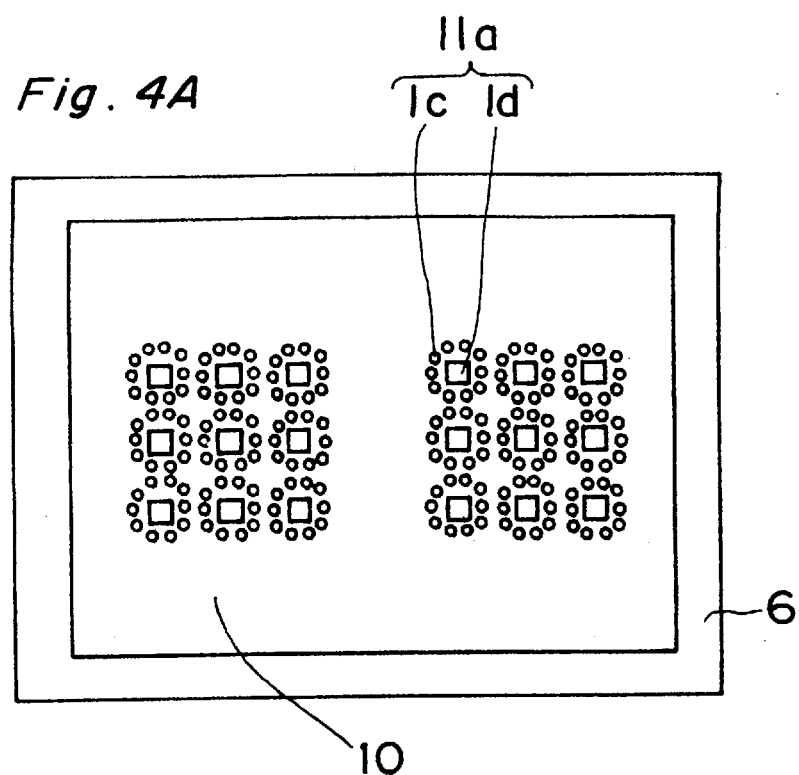
FIG. 4A is a top plan view illustrating the manner in which during the printing step a printing mask is aligned with a planar jig in the flowchart of FIG. 2.

In this way, the metallic paste layers 7 are formed on the planar jig 6 in the predetermined pattern complemental to the pattern of the apertures 11 in the printing mask 10. When the printing mask 10 having the pattern of the apertures 11 including wire pad apertures 1c and die pad apertures 1d as shown in FIG. 4A is employed, the metallic paste layers 7 deposited on the planar jig 6 are so patterned as to include wire pads 1a and die pads 1b in correspondence to the pattern of the apertures 11 in the printing mask 10 as shown in FIG. 4B.

Figure 4B:
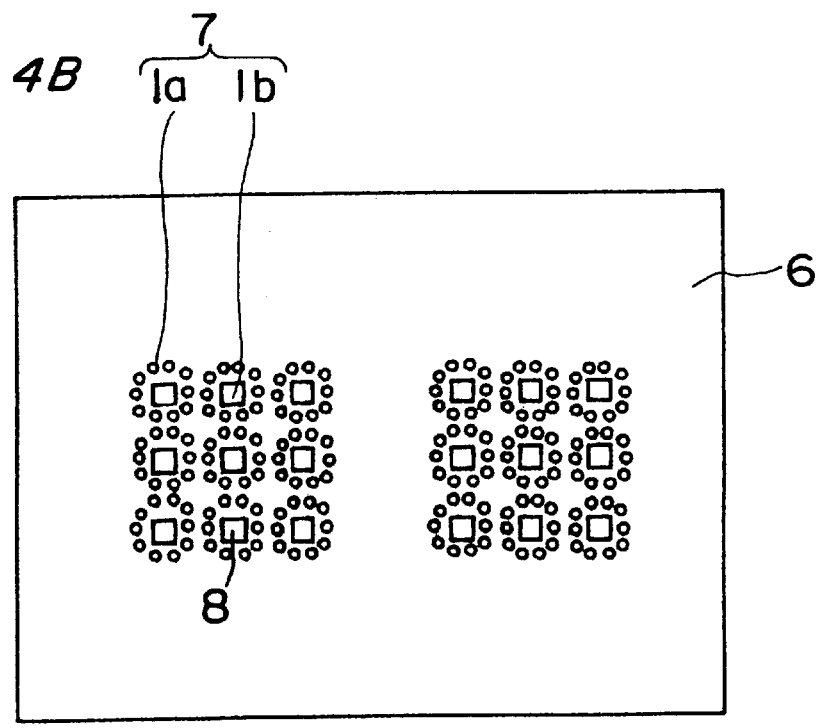
FIG. 4B is a view similar to FIG. 4A, illustrating a condition at which the printing stem terminates.
Figure 5A:
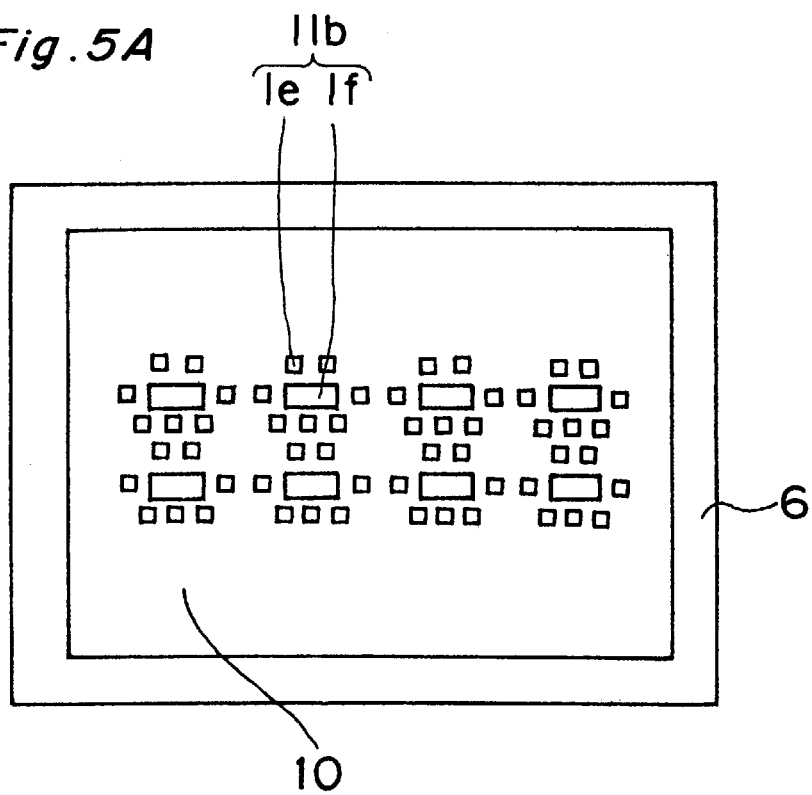
FIG. 5A is a top plan view illustrating the manner in which during the printing step a printing mask is aligned with a planar jig in the flowchart of FIG. 2.
Figure 5B:
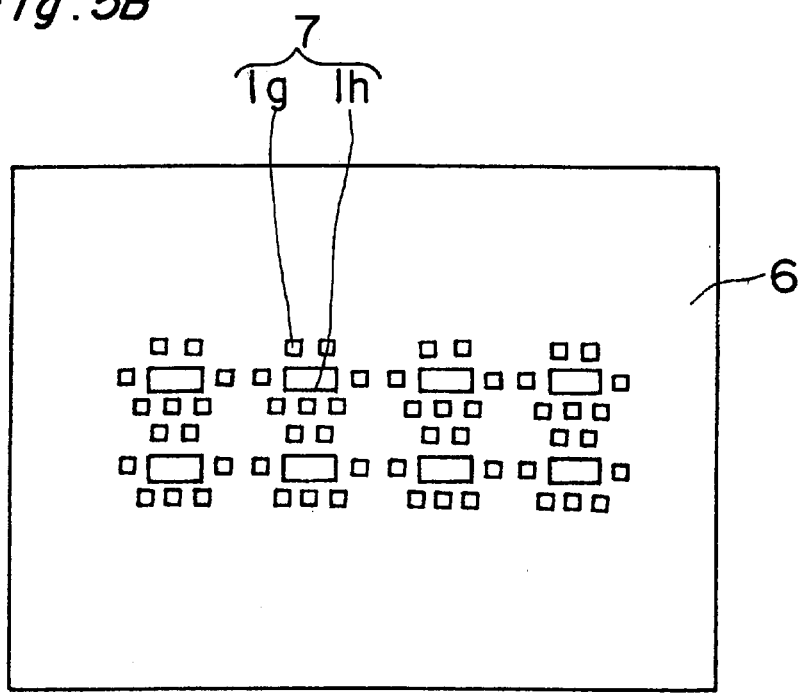
FIG. 5B is a view similar to FIG. 5A, illustrating a condition at which the printing stem terminates.

Alternatively, if the printing mask 10 having wire pad apertures 1e and die pad apertures if patterned thereon as shown in FIG. 5A is employed, the metallic paste layer 7 including the wire pads 1g and the die pads 1h, both different in shape from those shown in FIG. 4B can be formed on the planar jig 6 in correspondence to the pattern of the apertures 11 in the printing mask 10 as shown in FIG. 5B.

In the illustrated embodiment, the printing mask is employed in the form of a screen mask or a metal mask. The metallic paste that can be employed is of a composition containing a solid component made up of about 69% of a powder of metal (69 wt % of Ag, 0.1 or lower wt % of Pt) and 13% of a bonding component (such as, oxides of Pb, Cu, Bi, Fe or the like), with the balance being a diluting solvent (butylcarbitol, ethyl cellulose or the like). It is to be noted that by eliminating the use of the bonding component or by reducing the amount of the bonding component, the metallic paste layers may have no bondability with the planar jig 6. It is also to be noted that the mixing proportion of the diluting solvent and the solid component may be altered to change the characteristic of the paste.

Figure 6A:
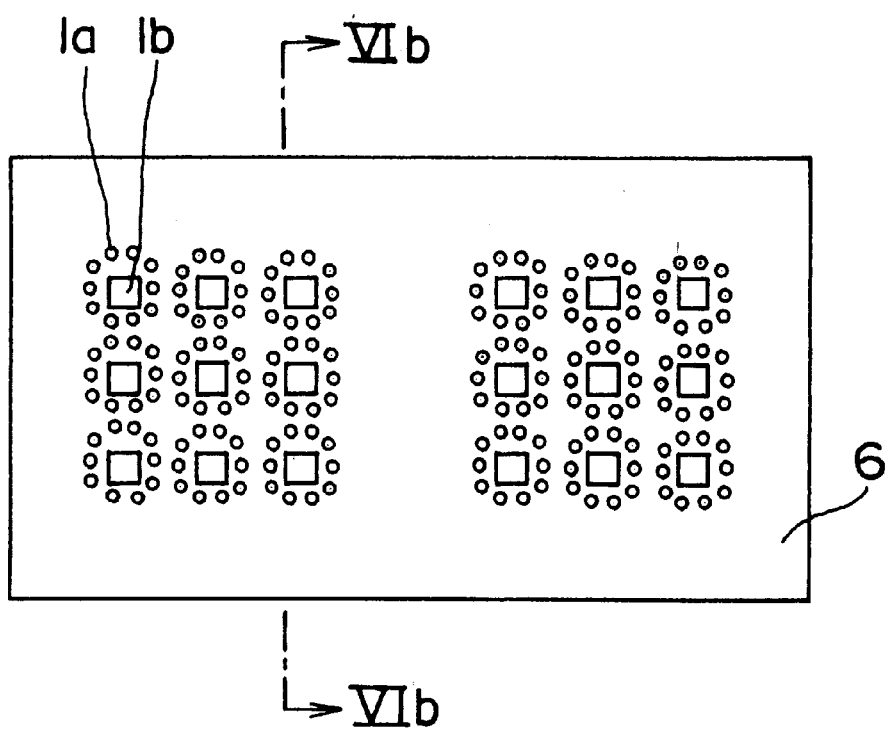
FIG. 6A is a top plan view of the planar jig showing a conductor sintering step in the flowchart of FIG. 2.
Figure 6B:
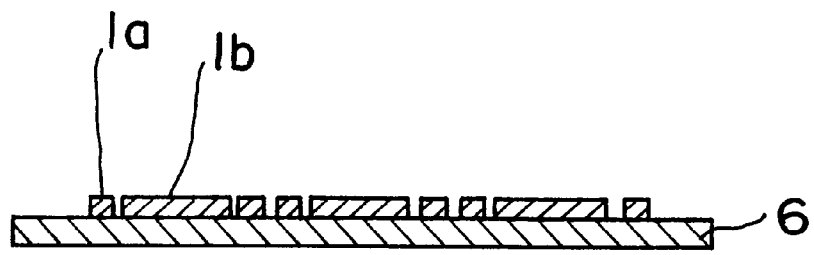
FIG. 6B is a cross-sectional view taken along the line VIb—VIb in FIG. 6A.

Instead of the use of the printing technique to form the metallic paste layers 7, a dispensing method may be employed in which a syringe or the like is employed to inject the metallic paste onto the planar jig in the required pattern, After the metallic conductor printing step S10, a conductor sintering step S11 is performed to dry and sinter the metallic paste layers 7 on the planar jig 6 at a peak sintering temperature of about 850° C. for 10 minutes. FIGS. 6A and 6B illustrate the wire pads 1a and the die pads 1b on the planar jig 6 after the metallic paste layers 7 have been sintered. In this conductor sintering step, the wire pads la and the die pads 1b are each represented by a sintered metal of a height within the range of 5 to 20 $\mu$m protruding upwardly from the planar jig 6.

Figure 7A:
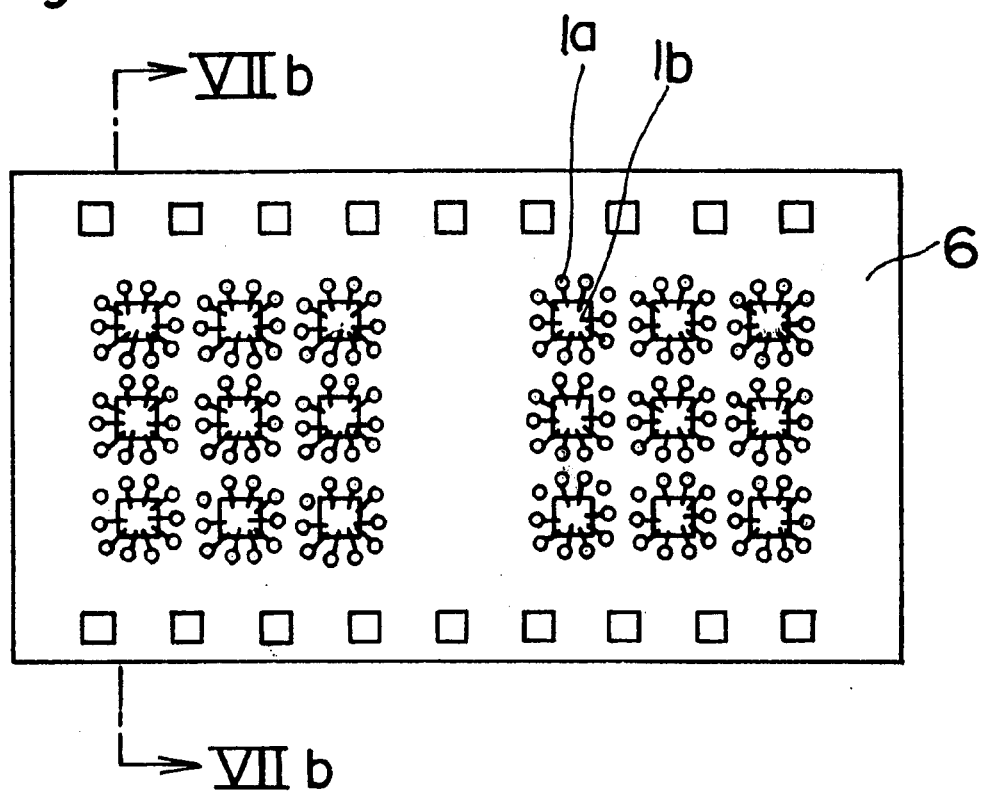
FIG. 7A is a top plan view of the planar jig showing a die-bonding to wire-bonding steps of the flowchart of FIG. 2.
Figure 7B:
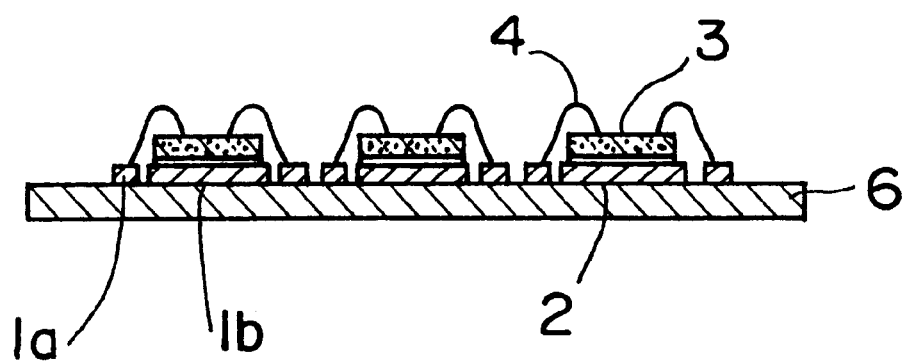
FIG. 7B is a cross-sectional view taken along the line VIIb—VIIb in FIG. 7A.

After the metallic layers 7 have been sintered, a die-bonding to wire-bonding step S12 takes place. This die-bonding to wire-bonding step is such that semiconductor chips 3 are bonded to the respective die pads 1b, formed on the planar jig 6, by the use of die bonds 3 and are subsequently connected with the wire pads 1a by means of wires 4. FIGS. 7A and 7B illustrate the wire pads 1a and the die pads 1b on the planar jig 6 after the die-bonding to wire-bonding step S12 has been completed.

Figure 8A:
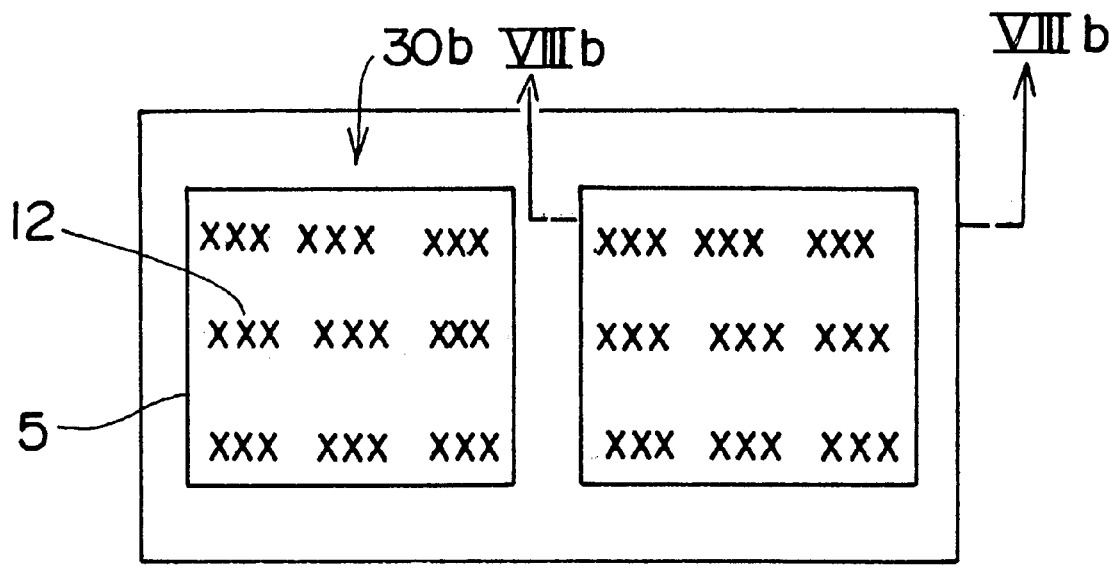
FIG. 8A is a top plan view of a semiconductor device member showing a resin sealing to marking step of the flowchart of FIG. 2.
Figure 8B:
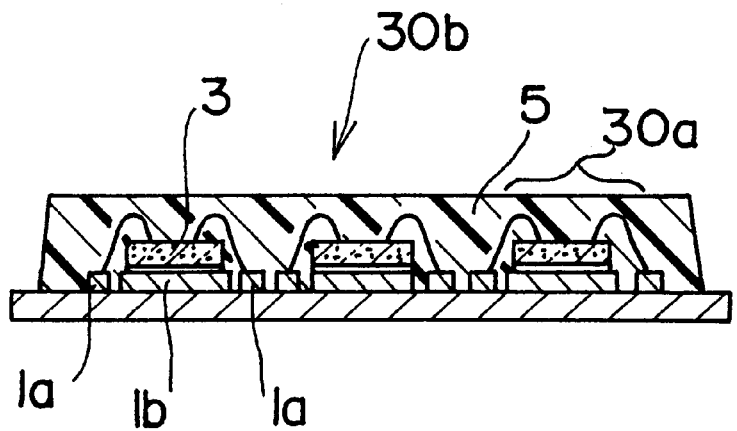
FIG. 8B is a cross-sectional view taken along the line VIIIb—VIIIb in FIG. 8A.

A resin-sealing to marking step S13 which takes place subsequent to the die-bonding to wire-bonding step S12 will now be described. During this resin-sealing to marking step S13, a semiconductor device member 30b including a plurality of unitary semiconductor devices 30a each made up of the semiconductor chip 3 on the corresponding die pad 1b and the wire pads 1a connected with the semiconductor chip 3 through the wires 4, is sealed by a resinous material 5 as shown in FIG. 8B. Markings 12 each indicative of the position of the respective unitary semiconductor device 3b as shown in FIG. 8A are formed on an external surface of the sealing resin 5 by the use of a laser. FIGS. 8A and 8B illustrate the semiconductor device member 30b on the planar jig 6 which has been formed with the markings 12.

Figure 9A:
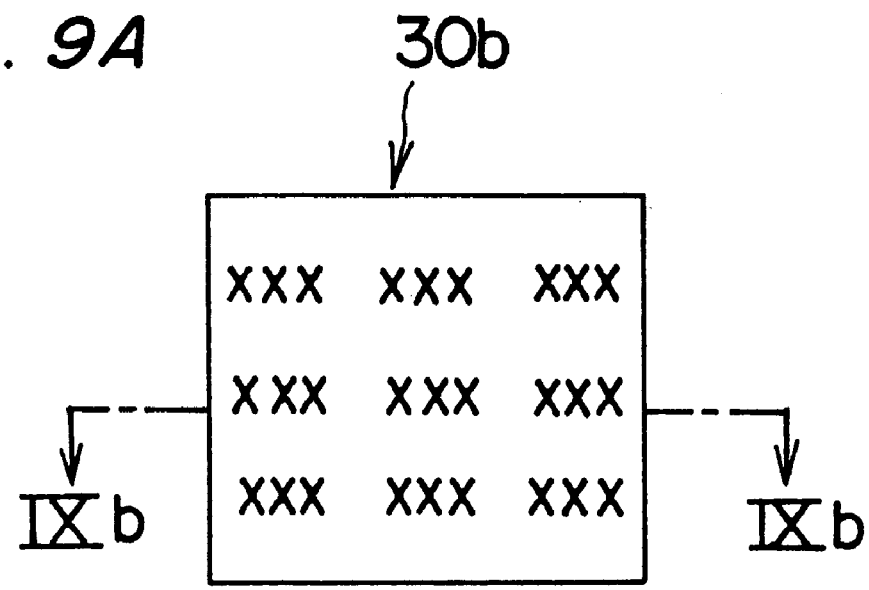
FIG. 9A is a top plan view of the semiconductor device member showing a jig removal step of the flowchart of FIG. 2.
Figure 9B:
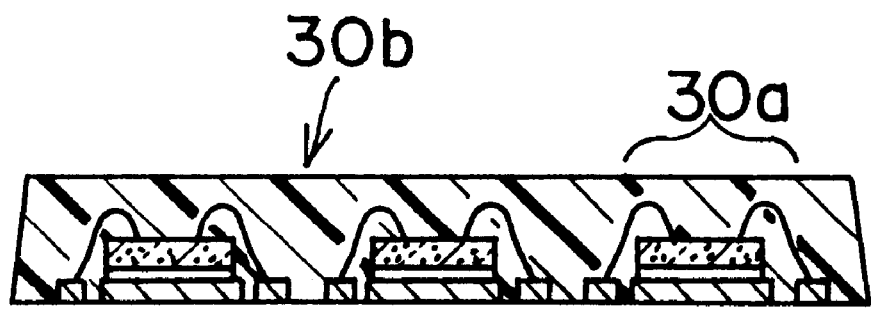
FIG. 9B is a cross-sectional view taken along the line IXb—IXb in FIG. 9A.

Thereafter, a jig removal step S14 takes place to remove the planar jig 6 from the semiconductor device member 30b to leave the latter separate from the planar jig 6. This can be accomplished by applying a stress to the planar jig 6 to allow the latter to be elastically deformed while the semiconductor device member 30b is peeled off from the elastically deformed planar jig 6. FIGS. 9A and 9B illustrate the semiconductor device member 30b, including nine units of semiconductor devices 30a, separated from the planar jig 6.

In order to avoid the separation of the semiconductor device member 30b from being disturbed, the planar jig 6 is preferably of a kind in which during the conductor sintering step S11 oxides or contents of material for the planar jig 6 will not precipitate on the surface of the planar jig 6. Specifically, a heat-resistant ferrous metal plate made of, for example, stainless steel is preferred for the planar jig 6.

Electric characteristics of the semiconductor device member 30b are subsequently tested at a test step S15.

Figure 10A:
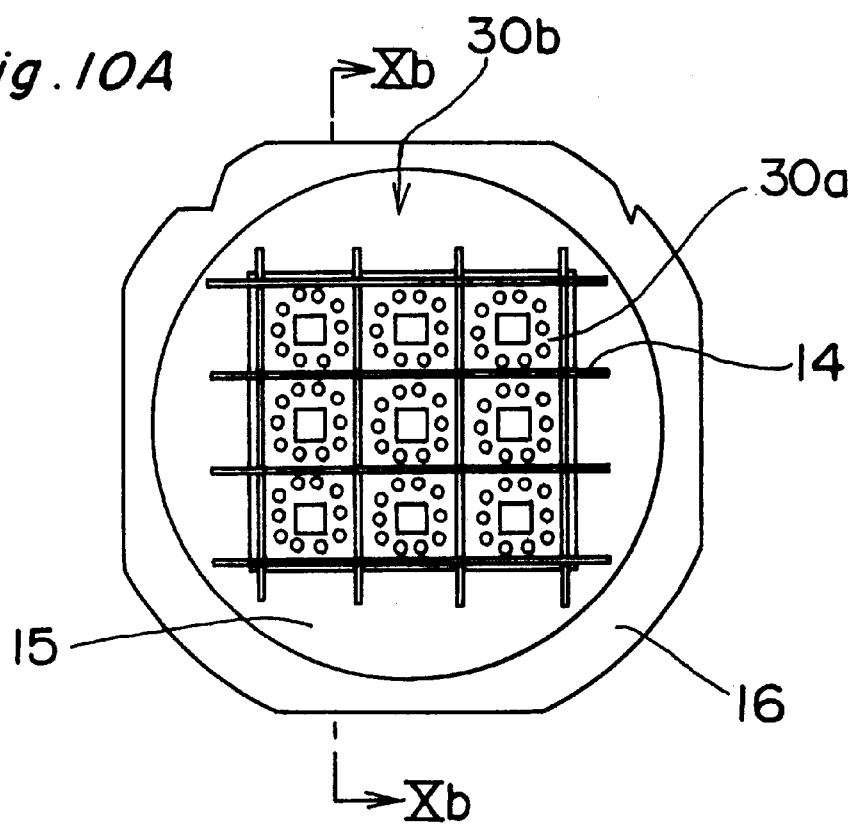
FIG. 10A is a top plan view of the semiconductor device member showing a scribing step of the flowchart of FIG. 2.
Figure 10B:
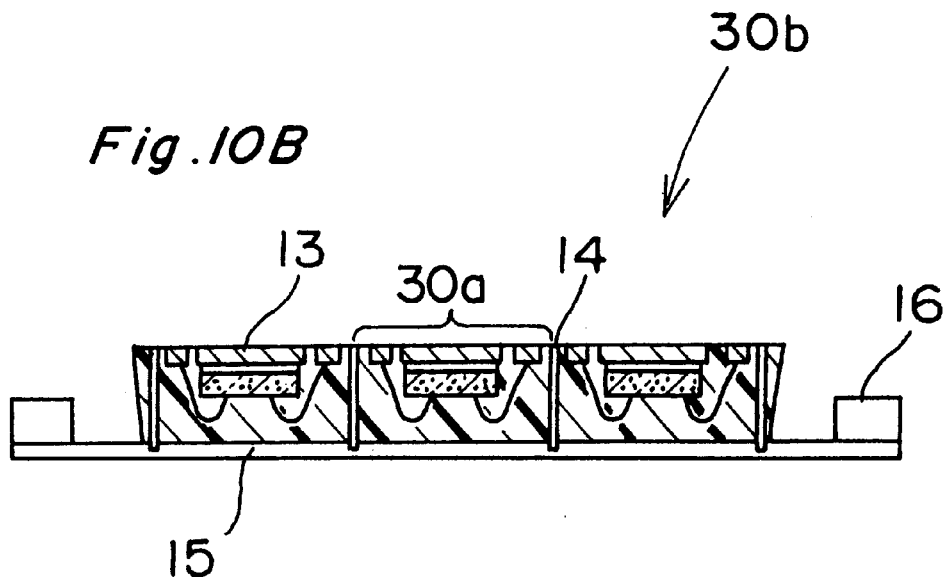
FIG. 10B is a cross-sectional view taken along the line Xb—Xb in FIG. 10A.
Figure 11A:
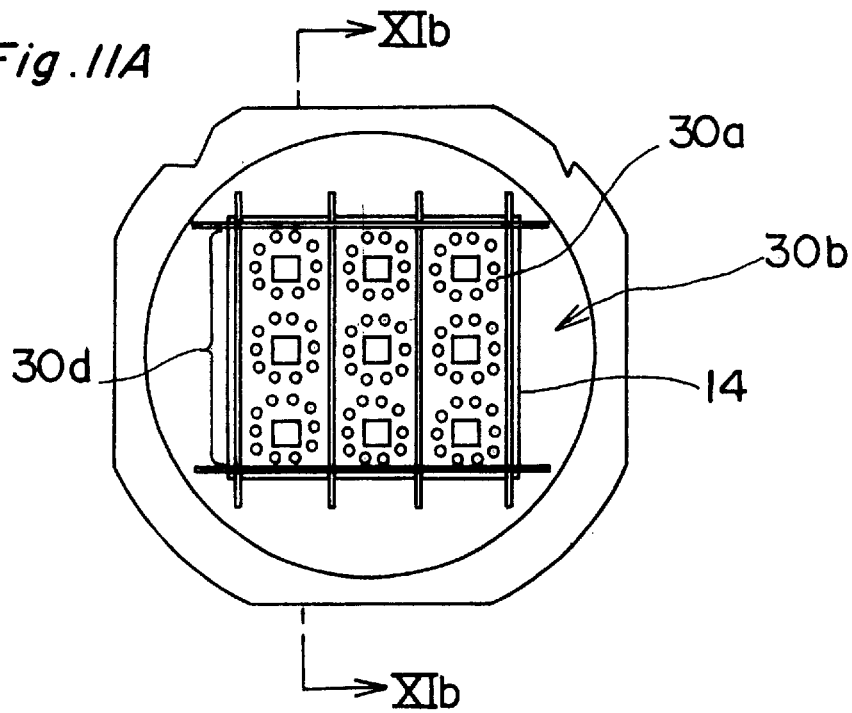
FIG. 11A is a top plan view of the semiconductor device member showing a scribing step of the flowchart of FIG. 2.
Figure 11B:
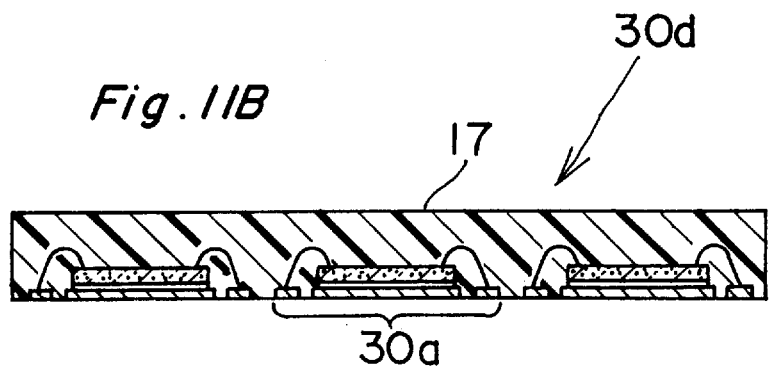
FIG. 11B is a cross-sectional view of a semiconductor array taken along the line XIb—XIb in FIG. 11A.
Figure 11C:
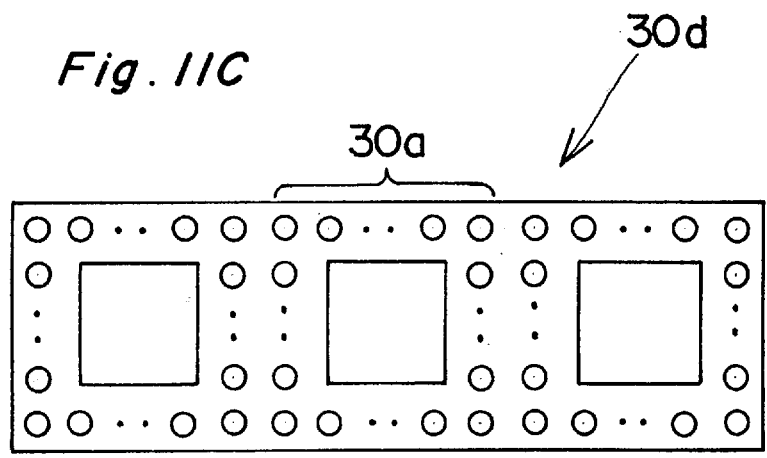
FIG. 11C is a bottom plan view of the semiconductor array.

The test step S15 is then followed by a scribing step S16 during which the semiconductor device member 30b including the plural unitary semiconductor devices 30a are cut to provide the separate unitary semiconductor devices 30a. Specifically, as shown in FIGS. 10A and 10B, in order to prevent the semiconductor devices from arbitrarily scattering after the semiconductor device members 30b have been cut, the semiconductor device members 30b are bonded to a support frame 10 by the use of an adhesive tape 15, which may be made of polyvinyl chloride. The semiconductor device member 30b is subsequently cut along predetermined lines 14 scribed to eventually provide nine units of the semiconductor devices 30a, by means of a dicing device (not shown). By doing so, it is clear that in the illustrated embodiment the semiconductor device member 30b provides the nine unitary semiconductor devices 30a when cut along the predetermined lines.

A packaging step S17 takes place subsequent to the scribing step S16. During the packaging step S17, the unitary semiconductor devices 30a in the form as bonded to the adhesive tape 15 are removed from the support frame 16 together with the adhesive tape 15 and arranged on a taping or tray for packaging to eventually provide the semiconductor devices 30 each being of the structure shown in FIG. 1.

It is to be noted that the scribing step S16 may alternatively be carried out by scribing a plurality of, for example, three parallel cutting lines 14 on the semiconductor device member 30b to eventually provide three semiconductor arrays 30d, each including the three unitary semiconductor devices 30a, when the semiconductor device member 30b is cut along the cutting lines 14.

Manufacturing of the semiconductor devices in the manner described above is particularly advantageous in that no die is needed during execution of the metallic conductor printing step S10 and the subsequent conductor sintering step S11 to form the die pads 1b. Also, since the planar jig is elastically deformed within its capability of elastic deformation, the planar jig can be reused, contributing to reduction in cost of fabricating the semiconductor devices.

Sintering of the metallic paste 7 is an effective method to permit the die pads 1b of sintered metal to be formed to a height within the range of 5 to 20 μm relative to the planar jig 6 with no need to use an etching or buffing or similar polishing. Selection of the height of the die pads 1b to the range of 5 to 20 μm effectively increases the bondability between the die pads 1b and the sealing resin 5 which is exhibited by the anchoring effect, resulting in increased reliability of the semiconductor devices. Similarly, since the wire pads 1a are also formed of the sintered metal, no smoothing or metal plating is needed to treat a surface of each of the wire pads 1a.

In addition, by using the printing mask 10 in which the wire pad apertures 1c and the die pad apertures 1d are arrayed substantially in a matrix pattern so that the plural die pads 1b and the plural wire pads 1a can be formed on the metallic base substrate 6 in a correspondingly matrix pattern, followed by integration of the die pads 1b and the wire pads 1a by means of the sealing resin 5 to thereby form the semiconductor device member 30b, the number of the semiconductor devices that can be fabricated from the metallic base substrate 6 of a given size can advantageously be increased.

Figure 12A:
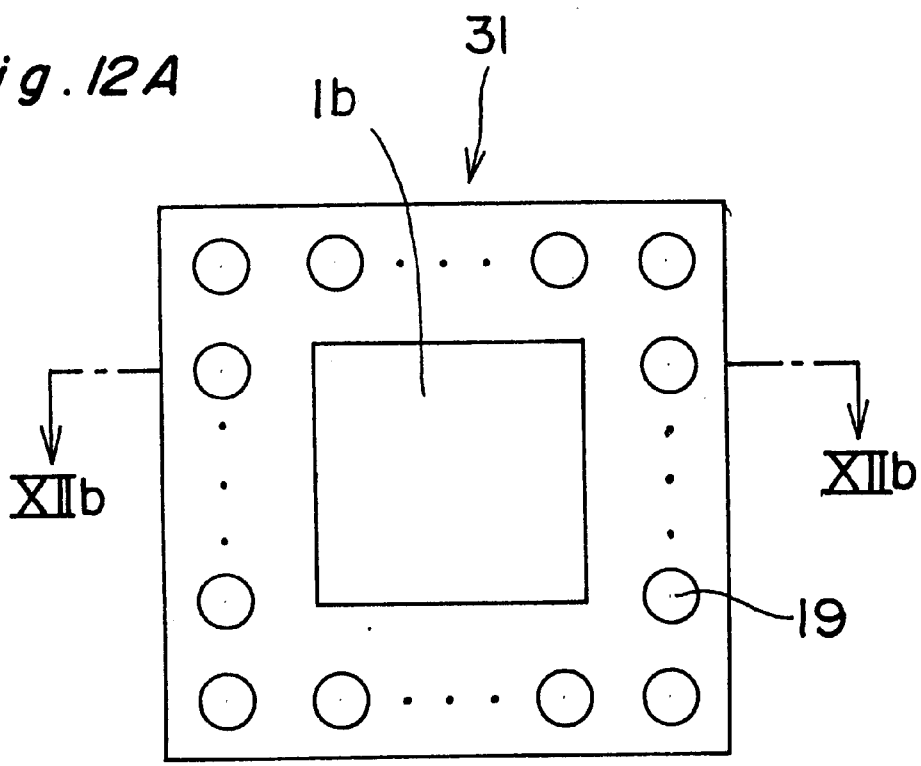
FIG. 12A is a bottom plan view of the semiconductor device according to a modification of the first embodiment of the present invention.
Figure 12B:
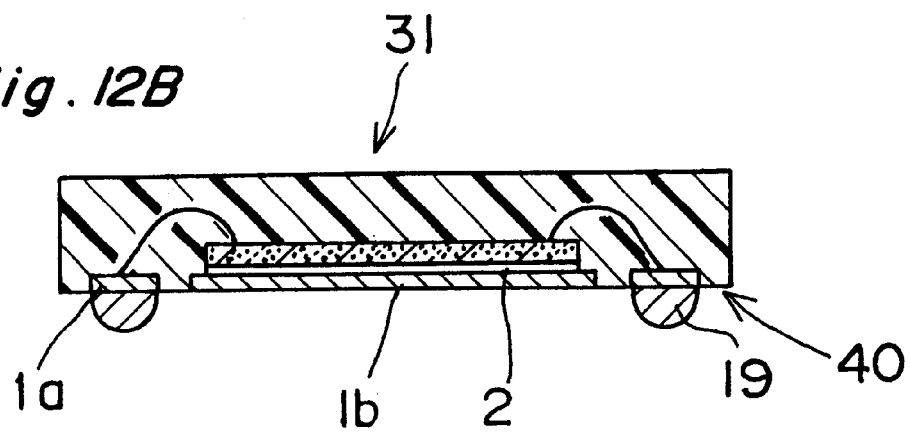
FIG. 12B is a cross-sectional view taken along the line XIIb—XIIb in FIG. 12A.

A modification of the first embodiment of the present invention explained above will now be described. Referring to FIGS. 12A and 12B, the semiconductor device 31 shown therein is substantially similar to the semiconductor device 30 shown in FIGS. 1A and 1B, but differs in that as shown in FIGS. 12A and 12B the wire pads 1a are formed with respective solder balls 19 each protruding outwardly from the external contact surface 40.

Figure 13:
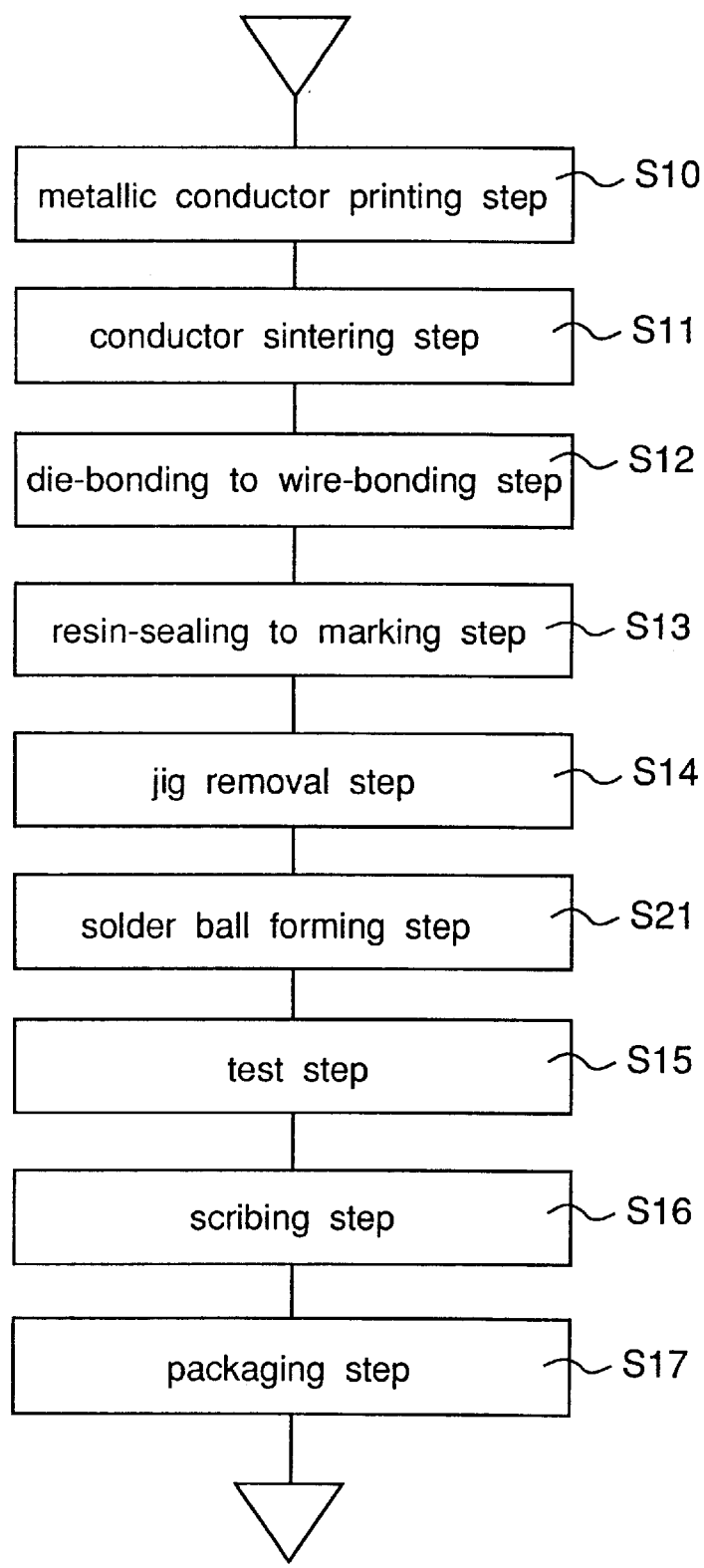
FIG. 13 is a flowchart showing the method of fabricating the semiconductor device according to the modification of the first embodiment of the present invention.
Figure 14:
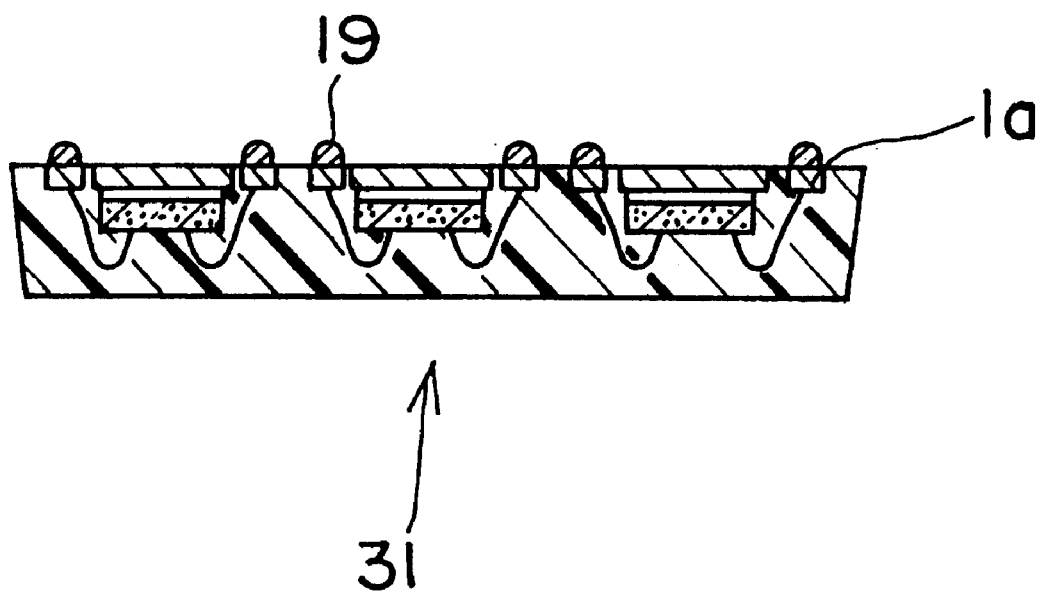
FIG. 14 is a cross-sectional view showing a step of forming solder balls in the flowchart of FIG. 13.

The method of fabricating the semiconductor device 31 is shown in FIG. 13. This method is substantially similar to the method used to fabricate the semiconductor device 30 of FIGS. 1A and 1B, but differs in that a solder ball forming step S21 is additionally employed as shown in FIG. 13. FIG. 14 illustrate the solder ball forming step S21 in which the solder balls 19 are formed in the wire pads 1a of the semiconductor device 31.

The use of the solder balls 19 in the semiconductor device 31 is particularly advantageous in that the reliability can be increased when the semiconductor device 31 is mounted on the motherboard. In addition, since heat can be conducted from the semiconductor device 31 through the solder balls 19, the use of the solder balls 19 effectively increases the efficiency of radiation of heat in the semiconductor device 31.

Second Embodiment

Figure 15A:
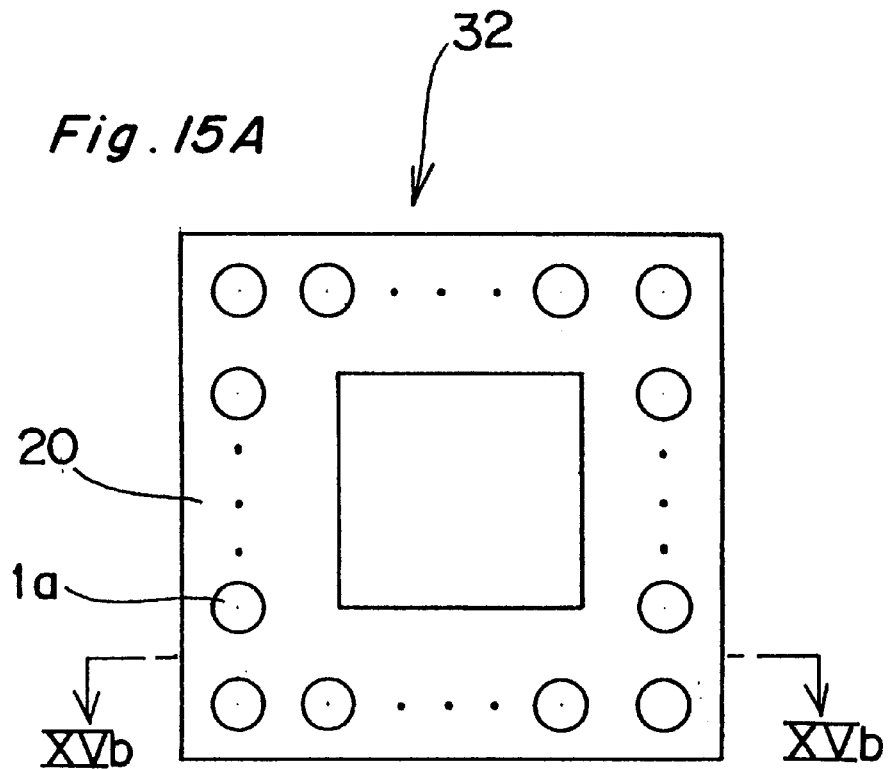
FIG. 15A is a bottom plan view of the semiconductor device according to a second embodiment of the present invention.
Figure 15B:
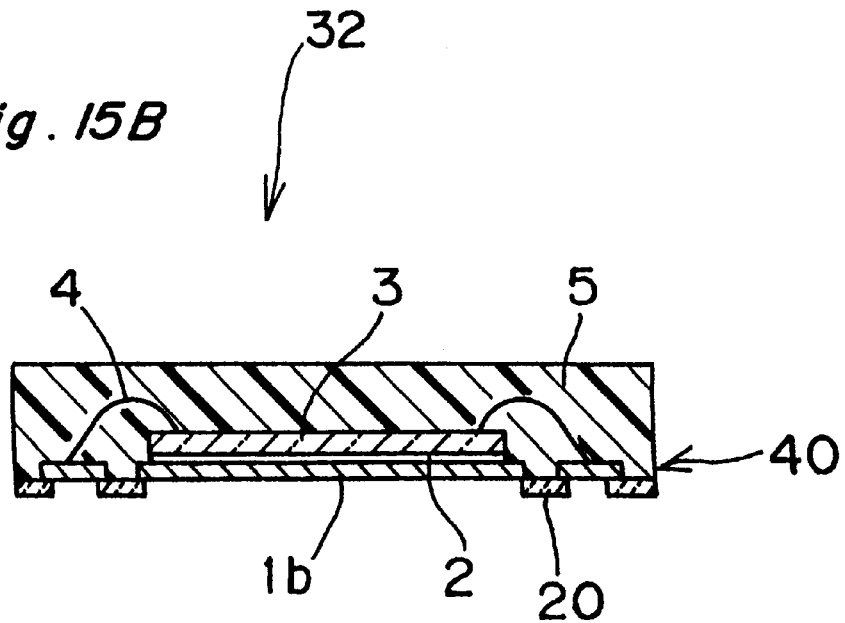
FIG. 15B is a cross-sectional view taken along the line XVb—XVb in FIG. 15A.

The semiconductor device according to a second embodiment of the present invention is identified by 32 in FIGS. 15A and 15B. As shown therein, the semiconductor device 32 includes a resist layer 20 of an epoxy resin formed on the external contact surface 40 so as to continuously cover a peripheral portion of each die pad 1b and a peripheral portion of the wire pad 1a adjacent the die pads 1b. Specifically, the resist layer 20 is formed so as to cover a boundary between the sealing resin 5 and the die pads 1b on the external contact surface 40, and also to cover the boundary between the sealing resin 5 and the wire pads 1a.

Figure 17:
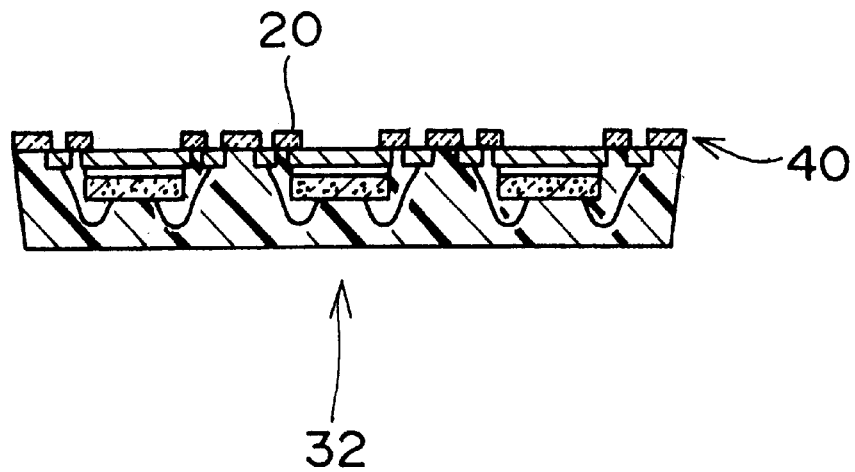
FIG. 17 is a cross-sectional view showing a resist forming step of the flowchart of FIG. 16.

The method of fabricating the semiconductor device 32 is substantially similar to that shown in FIG. 13, except that a resist forming step S31 is employed in place of the solder ball forming step S21. FIG. 17 illustrates the resist forming step S31 during which the resist layer 20 is formed on the external contact surface 40 so as to continuously cover a peripheral portion of each die pad 1b and a peripheral portion of the wire pad 1a adjacent the die pads 1b.

The resist layer 20 in the semiconductor device 32 prevents moisture from entering the interface between the sealing resin 5 and the pads 1a and 1b to thereby protect the sealing resin 5. Accordingly, the reliability of the semiconductor device 32 can be increased.

Figure 18A:
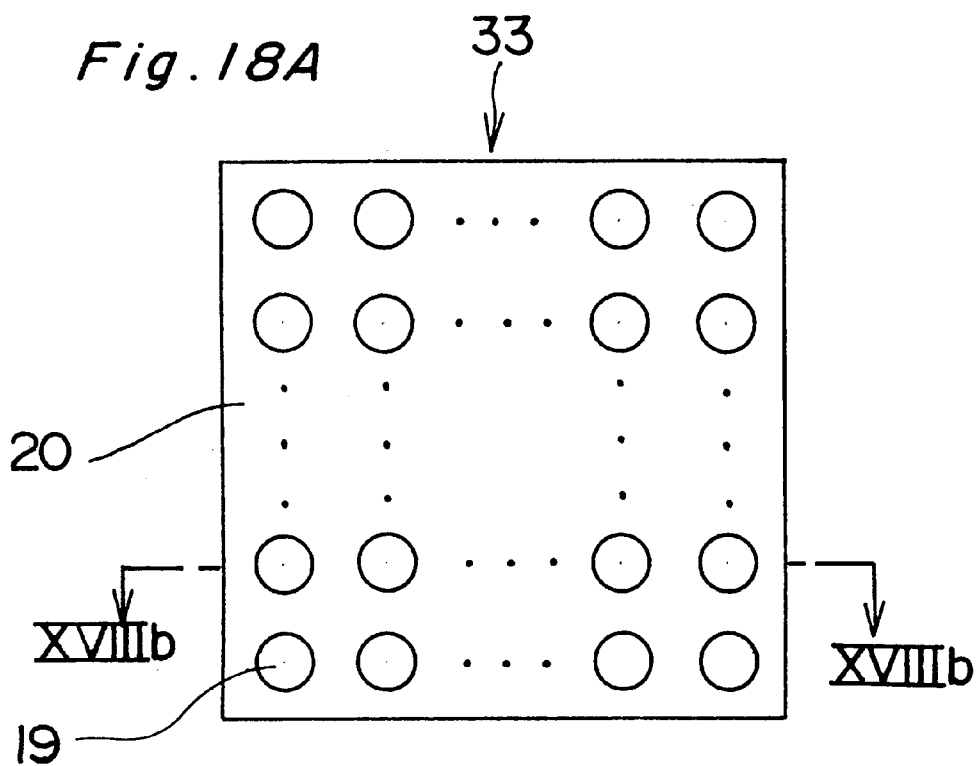
FIG. 18A is a bottom plan view of the semiconductor device according to a modification of the second embodiment of the present invention.
Figure 18B:
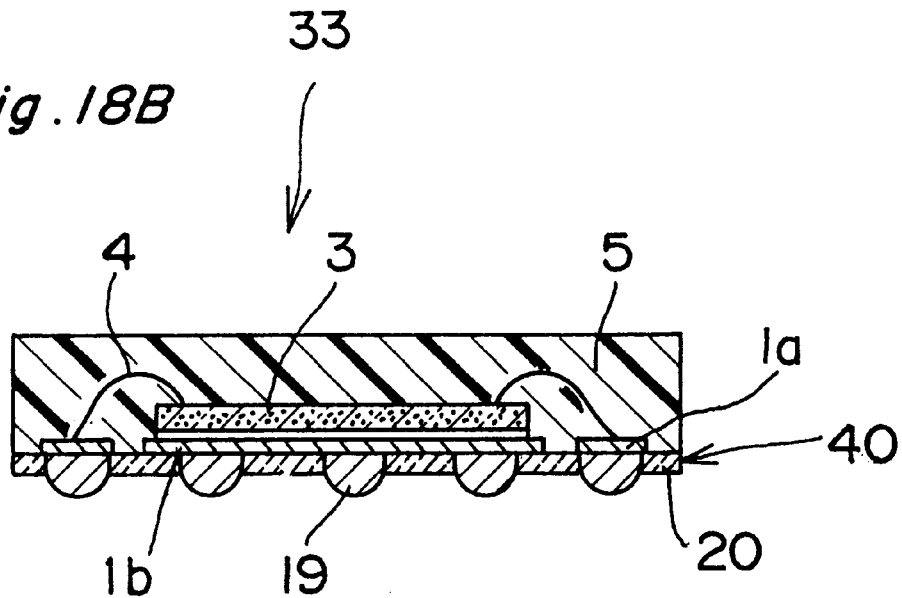
FIG. 18B is a cross-sectional view taken along the line XVIIIb—XVIIIb in FIG. 18A.

A modification of the semiconductor device 32 according to the second embodiment of the present invention is shown in FIGS. 18A and 18B. Referring to FIGS. 18A and 18B, the semiconductor device now identified by 33 is substantially similar to the semiconductor device 15A and 15B, but differs in that the solder balls 19 are formed on the external contact surface 40 so as to protrude outwardly from the wire pads 1a and the die pad 1b as in a manner substantially similar to that shown in FIGS. 12A and 12B.

Figure 16:
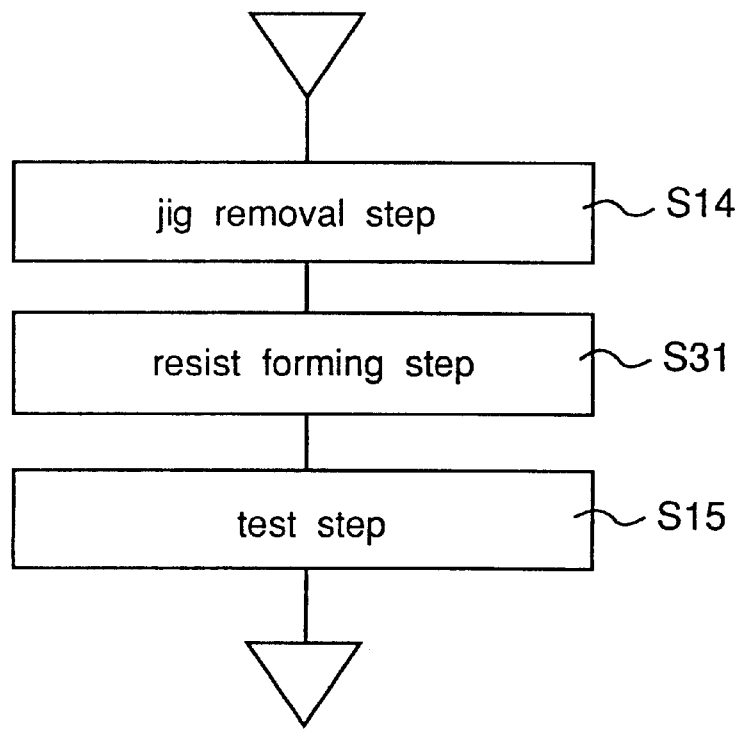
FIG. 16 is a flowchart showing the method of fabricating the semiconductor device according to the second embodiment of the present invention.
Figure 20A:
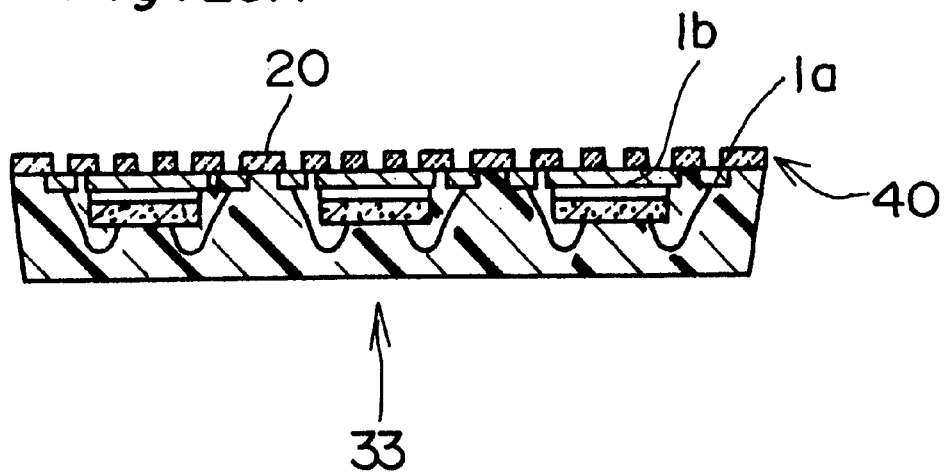
FIGS. 20A and 20B are cross-sectional views showing a resist forming step and a solder ball forming step of the flowchart of FIG. 19, respectively.
Figure 20B:
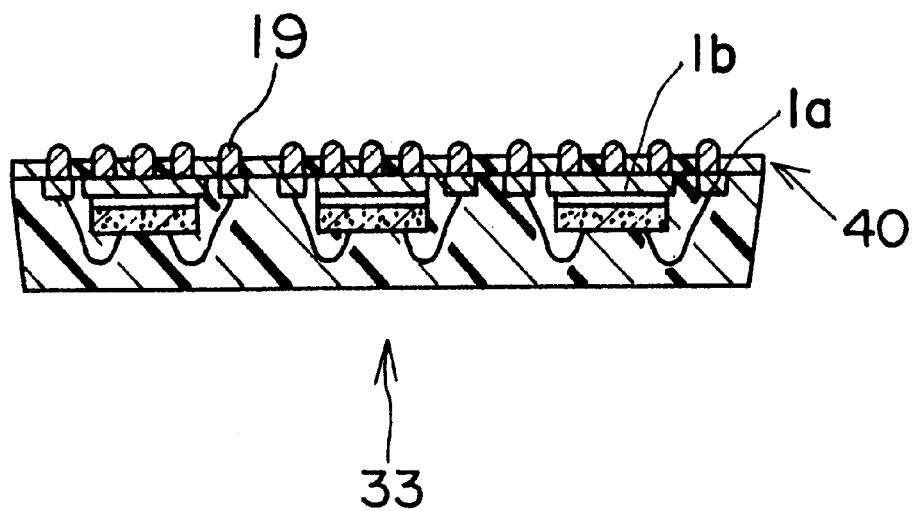

To form the solder balls 19 in the semiconductor device 33, the method similar to that shown in FIG. 16 is employed, but differs from FIG. 16 in that a solder ball forming step S42 is employed following the resist forming step S31 as shown in FIG. 19. FIG. 20A illustrates the resist forming step S31 during which the resist layer 20 is formed on the external contact surface 40 so as to continuously cover a peripheral portion of each die pad 1b and a peripheral portion of the wire pad 1a adjacent the die pads 1b. However FIG. 20B illustrates the solder ball forming step S41 which takes place subsequent to the resist forming step S31 and during which the solder balls 19 are formed so as to protrude outwardly from the wire pads 1a and the die pad 1b.

The resist layer 20 in the semiconductor device 32 prevents moisture from entering the interface between the sealing resin 5 and the pads 1a and 1b to thereby protect the sealing resin 5. On the other hand, the solder balls 19 are effective in facilitating contact of the semiconductor device 33 with the motherboard. Accordingly, it is clear that the reliability of the semiconductor device 33 can further be increased.

Third Embodiment

Figure 21A:
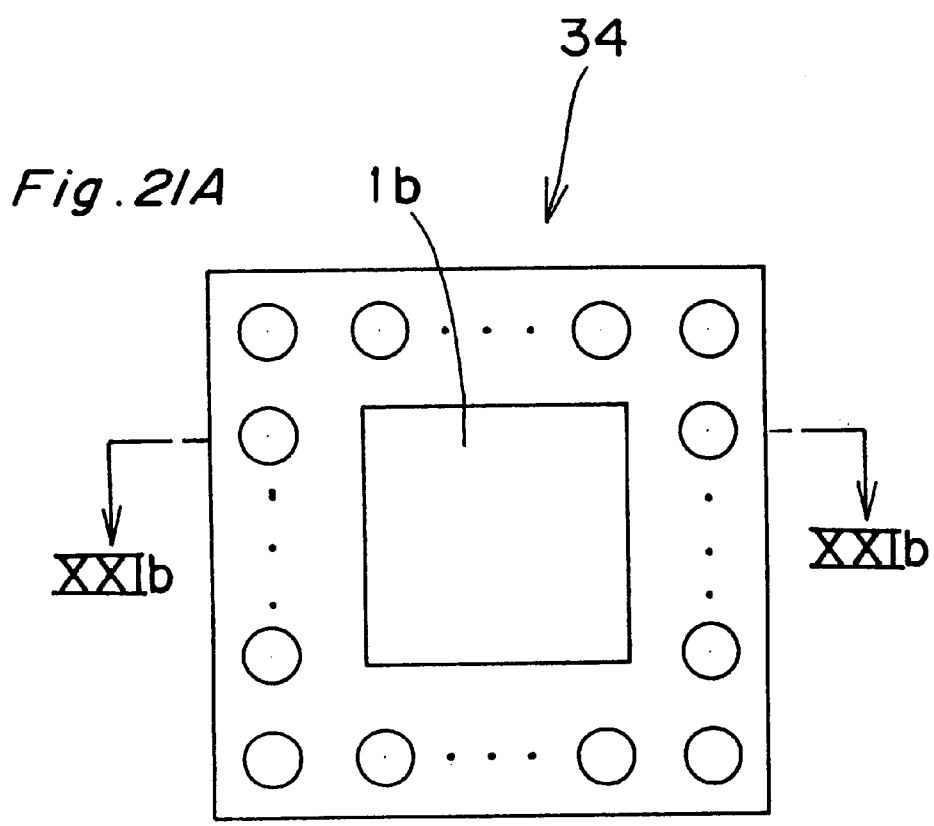
FIG. 21A is a bottom plan view of the semiconductor device according to a third embodiment of the present invention.
Figure 21B:
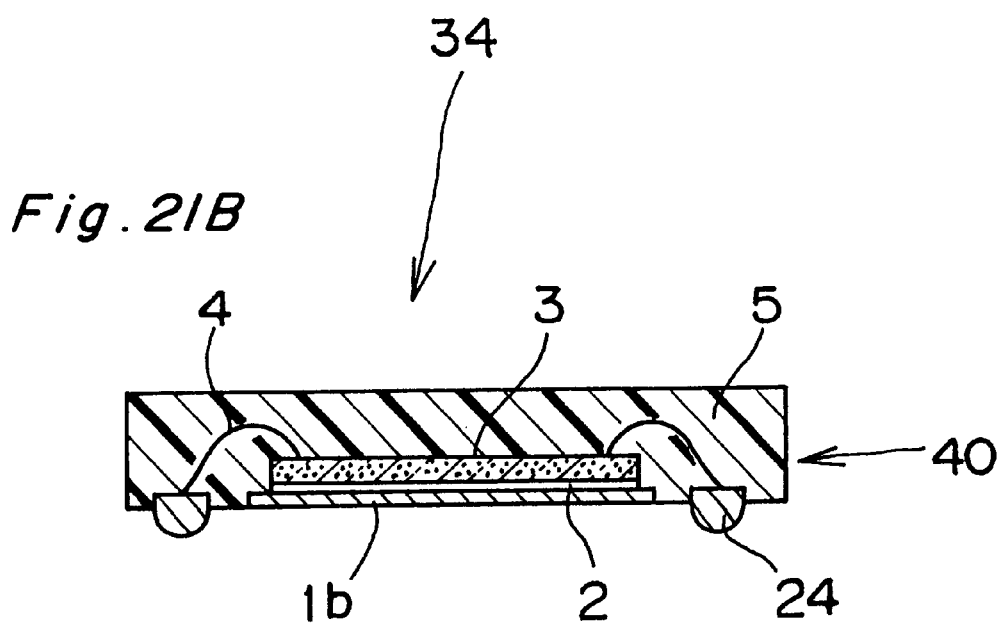
FIG. 21B is a cross sectional view taken along the line XXIb—XXIb in FIG. 21A.

Referring to FIGS. 21A and 21B, the semiconductor device 34 is substantially similar to the semiconductor device 30 shown in FIGS. 1A and 1B, but differs in that each of the wire pads shown by 24 in FIGS. 21A and 21B is in the form of a protrusion protruding outwardly from the external contact surface 40 of the sealing resin 5.

Figure 22A:
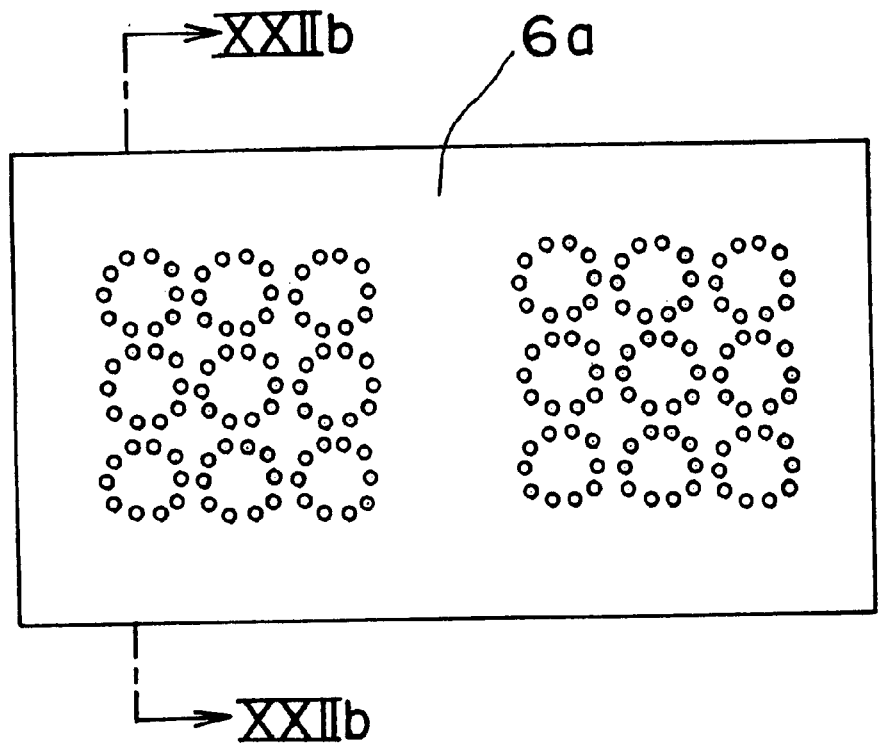
FIG. 22A is a top plan view of the planar jig used in the manufacture of the semiconductor according to the third embodiment of the present invention.
Figure 22B:
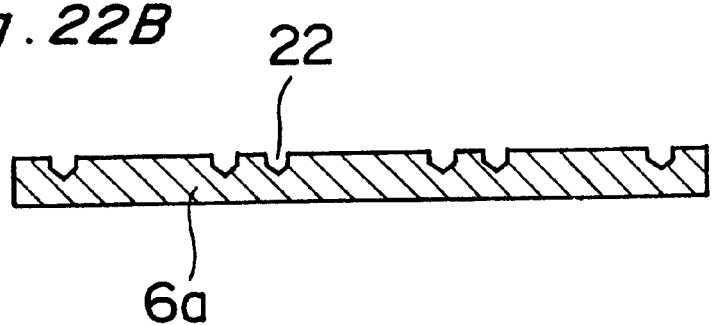
FIG. 22B is a cross-sectional view taken along the line XXIIb—XXIIb in FIG. 22A.
Figure 23A:
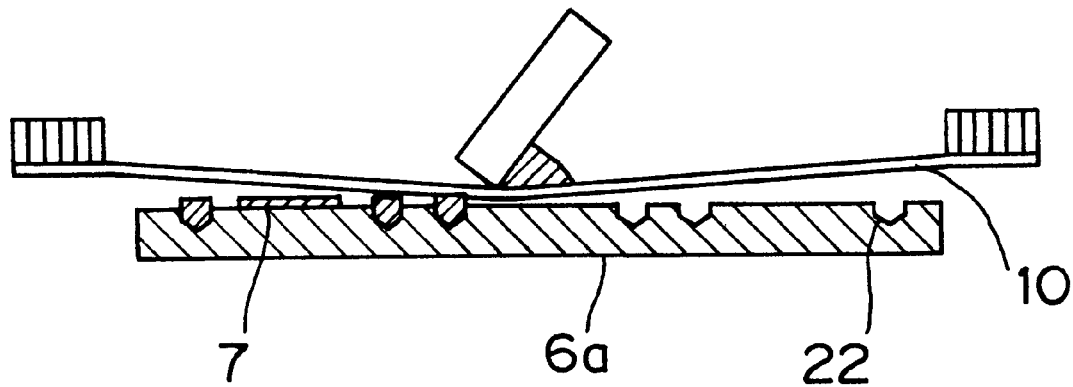
FIGS. 23A and 23B are sectional views showing the metal conductor printing step during the manufacture of the semiconductor device according to the third embodiment of the present invention, showing respective conditions in which the metal conductor is being formed and is completely formed.
Figure 23B:
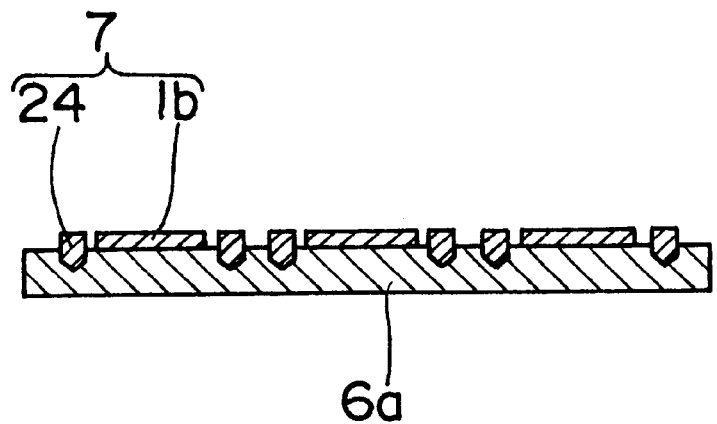

The semiconductor device 34 having the protruding wire pads 24 can be fabricated by the method shown in and described with reference to FIG. 2. However, the planar jig 6a used to fabricate the semiconductor device 34 must have, as shown in FIGS. 22A and 22B, recesses 22 complementary in shape to the protruding wire pads 24. The metal conductor printing step S10 utilizing the printing mask 10 in combination with the planar jig 6a of the configuration best shown in FIG. 22B, is shown in FIGS. 23A and 23B. It will readily be understood that as the squeegee is moved over the printing mask 10 the metallic paste penetrates through the screen 10 and is eventually deposited in the recesses 22 in the planar jig 6.

Fourth Embodiment

Figure 24A:
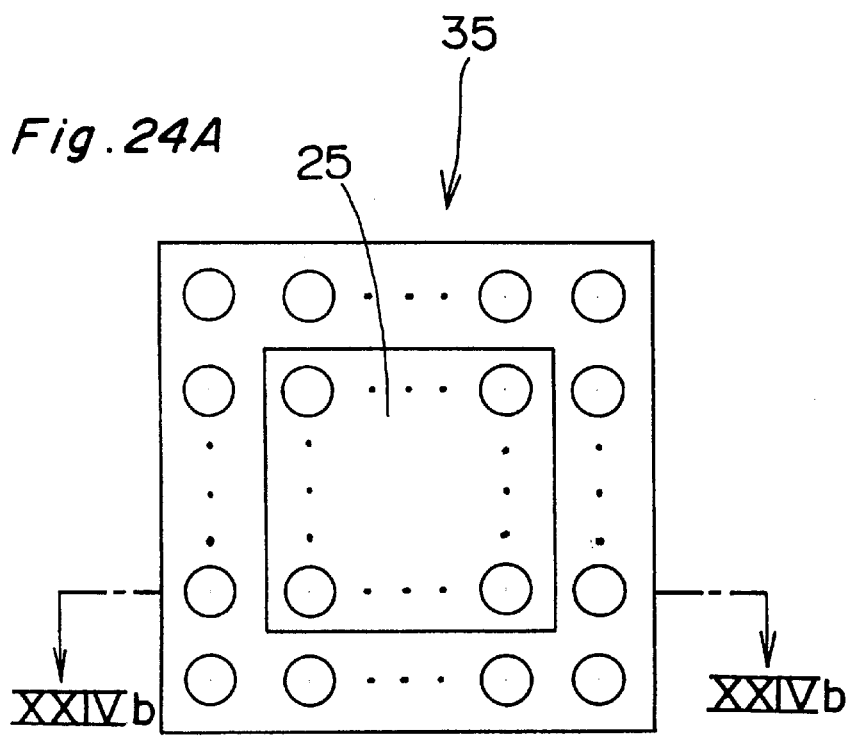
FIG. 24A is a bottom plan view of the semiconductor device according to a fourth embodiment of the present invention.
Figure 24B:
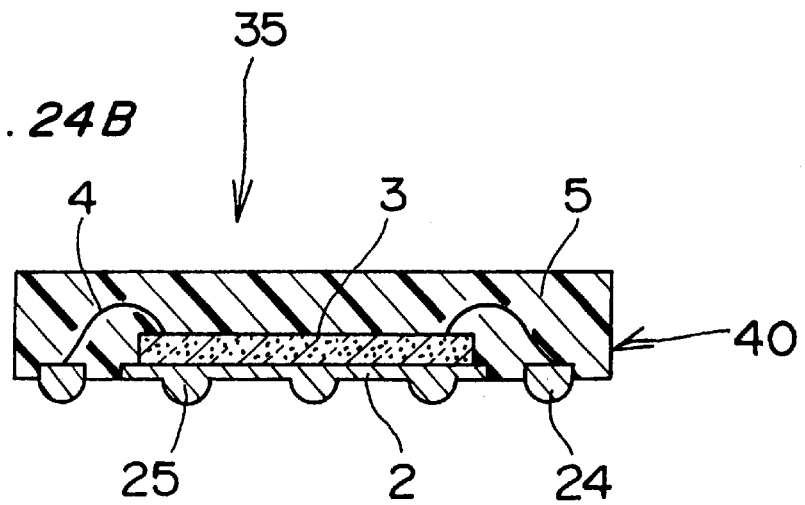
FIG. 24B is a cross-sectional view taken along the line XXIVb—XXIVb in FIG. 24A.

The semiconductor device according to a fourth embodiment of the present invention is shown by 35 in FIGS. 24A and 24B. This semiconductor device 35 is substantially similar to the semiconductor device of FIGS. 1A and 1B, but differs in that as shown in FIGS. 24A and 24B, both of the wire pads and the die pad are in the form of protrusions 24 and 25, respectively, that protrude outwardly from the external contact surface 40 of the sealing resin 5.

Figure 25A:
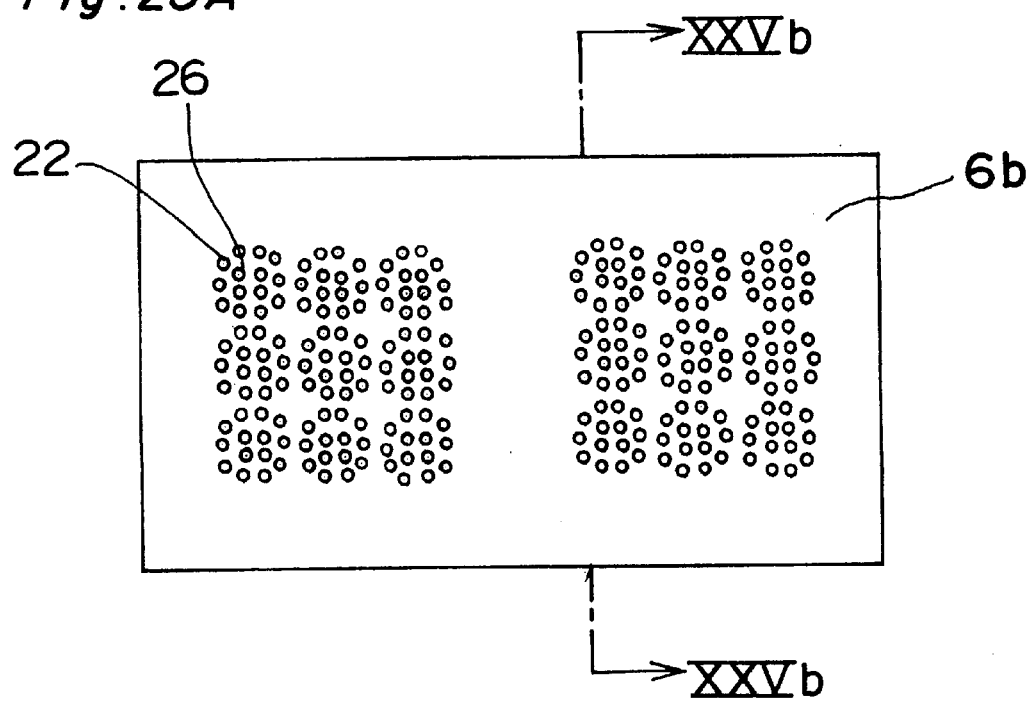
FIG. 25A is a top plan view of the planar jig used in the manufacture of the semiconductor according to the fourth embodiment of the present invention.
Figure 25B:
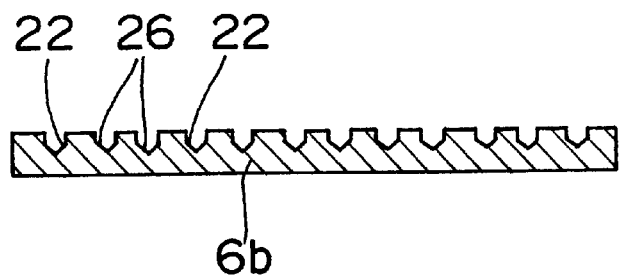
FIG. 25B is a cross-sectional view taken along the line XXVb—XXVb in FIG. 25A.

The semiconductor device 35 having the protruding wire pads 24 and the partially protruding die pad 25 can be fabricated in a manner substantially similar to the flowchart of FIG. 2. However during the metal conductor printing step S10, the planar jig 6b of a configuration shown in FIGS. 25A and 25B is employed. As shown in FIGS. 25A and 25B, the planar jig 6b has a plurality of recesses 22 and 26 complementary in shape to the protruding wire pads 24 and the partially protruding die pad 25 formed therein respectively.

Figure 26A:
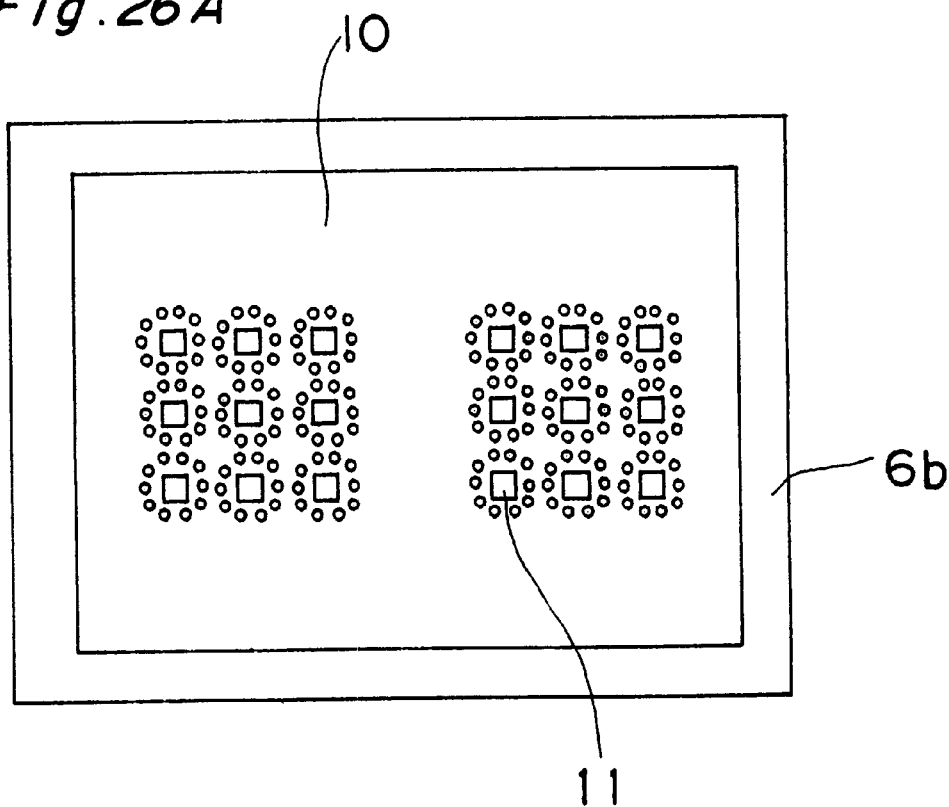
FIG. 26A is a top plan view illustrating the manner in which during the printing step a printing mask is aligned with a planar jig during the manufacture of the semiconductor device according to the fourth embodiment of the present invention.
Figure 26B:
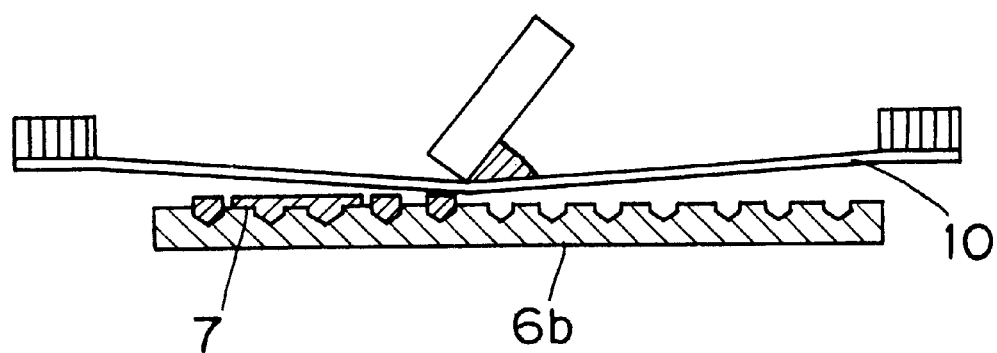
FIG. 26B is a view similar to FIG. 26A, illustrating a condition at which the printing stem terminates.
Figure 27A:
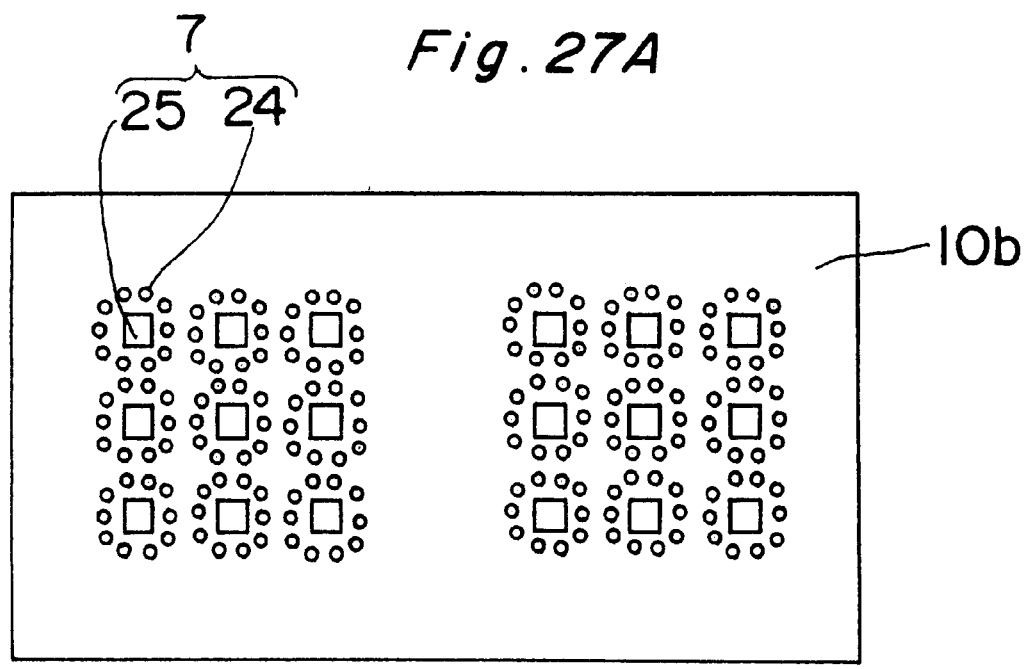
FIG. 27A is a top plan view of the planar jig used during the manufacture of the semiconductor device according to the fourth embodiment of the present invention.
Figure 27B:
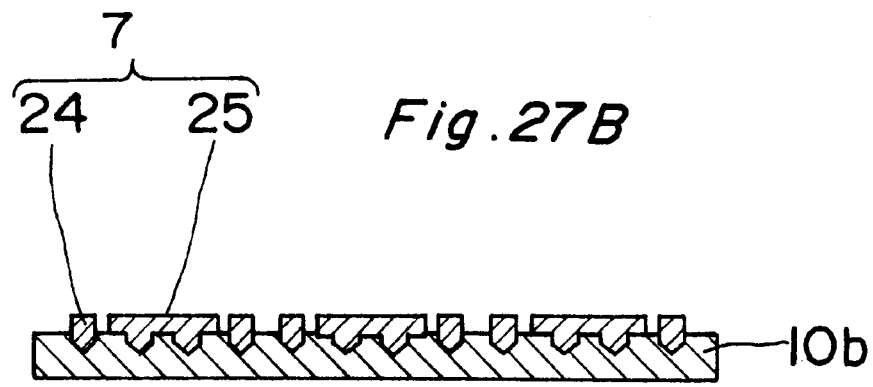
FIG. 27B is a cross-sectional view taken along the line XXVIIb—XXVIIb in FIG. 27A.

The metal conductor printing step S10 utilizing the printing mask 10 in combination with the planar jig 6a of the configuration best shown in FIG. 25B is shown in FIGS. 26A and 26B, and it will readily be understood that as the squeegee is moved over the printing mask 10 the metallic paste penetrates through the screen 10 and eventually deposits in the recesses 24 and 25 in the planar jig 6 is shown in FIGS. 27A and 27B.

Figure 28A:
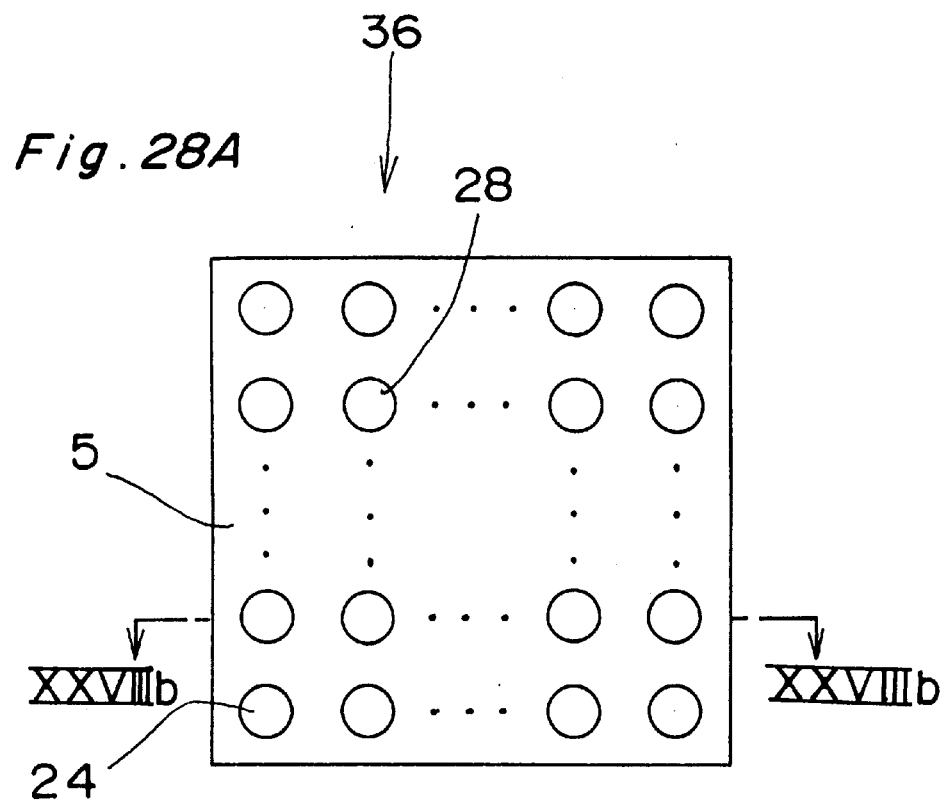
FIG. 28A is a bottom plan view of the semiconductor device according to a modification of the fourth embodiment of the present invention.
Figure 28B:
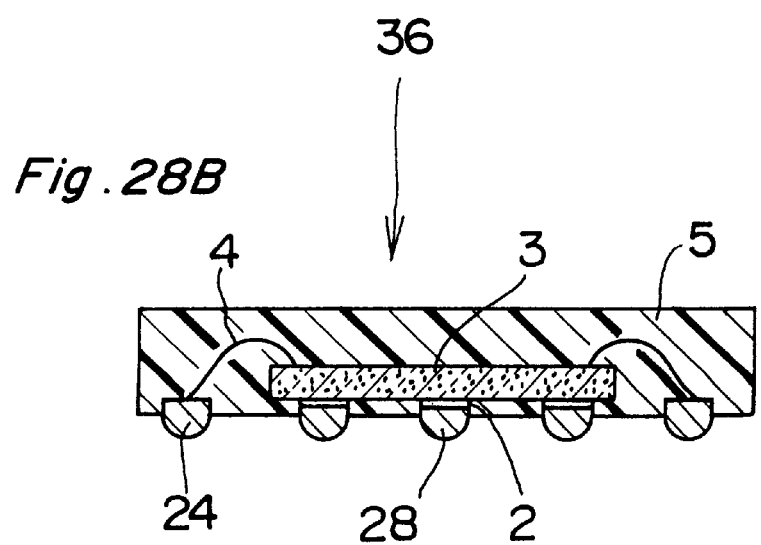
FIG. 28B is a cross-sectional view taken along the line XXVIIIb—XXVIIIb in FIG. 28A.

A modified form of the semiconductor device 35 is shown by 36 in FIGS. 28A and 28B. The semiconductor device 36 shown in FIGS. 28A and 28B is substantially similar to the semiconductor device 35 shown in FIGS. 24A and 24B, but differs in that the semiconductor chip 3 in the modification is mounted on a plurality of convex die pads 28 protruding outwardly from the external contact surface of the sealing resin 5.

Figure 29A:
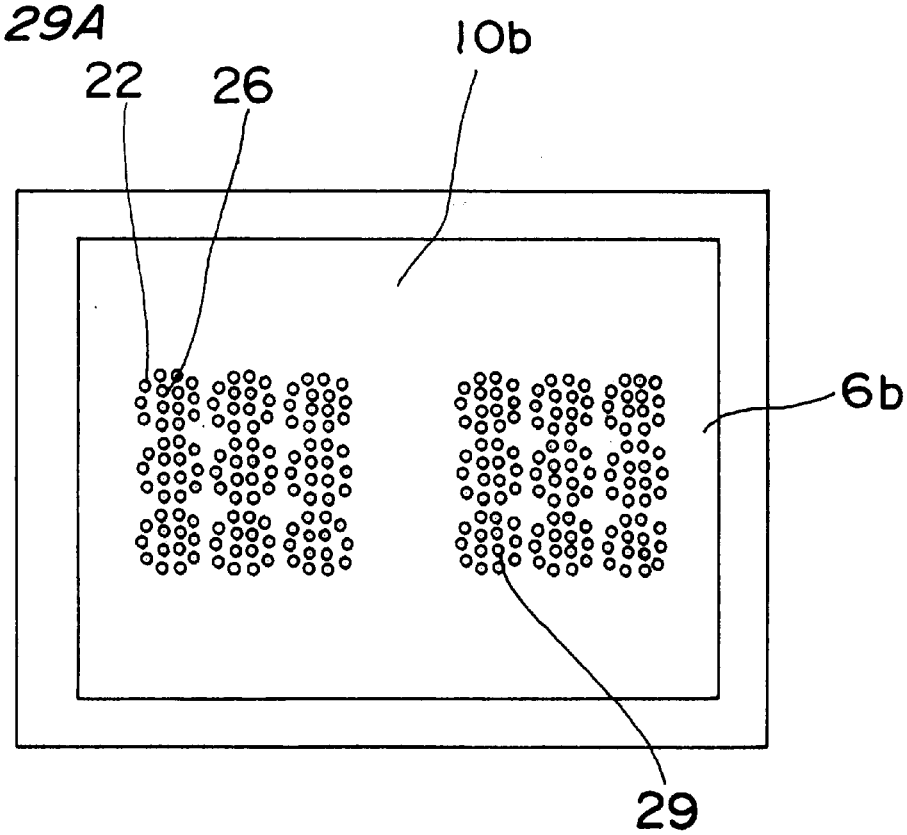
FIG. 29A is a top plan view illustrating the manner in which during the printing step a printing mask is aligned with a planar jig during the manufacture of the semiconductor device according to the modification of the fourth embodiment of the present invention.
Figure 29B:
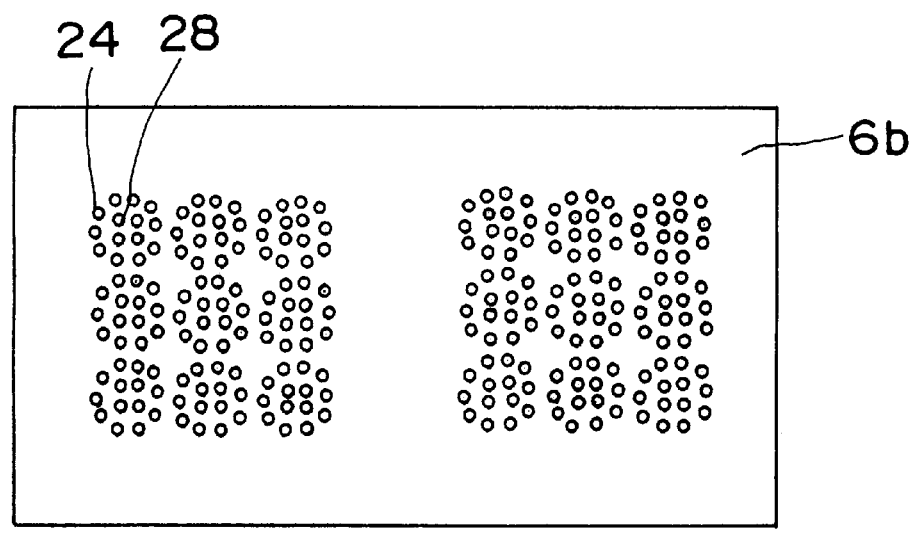
FIG. 29B is a view similar to FIG. 29A, illustrating a condition at which the printing step terminates.
Figure 30A:
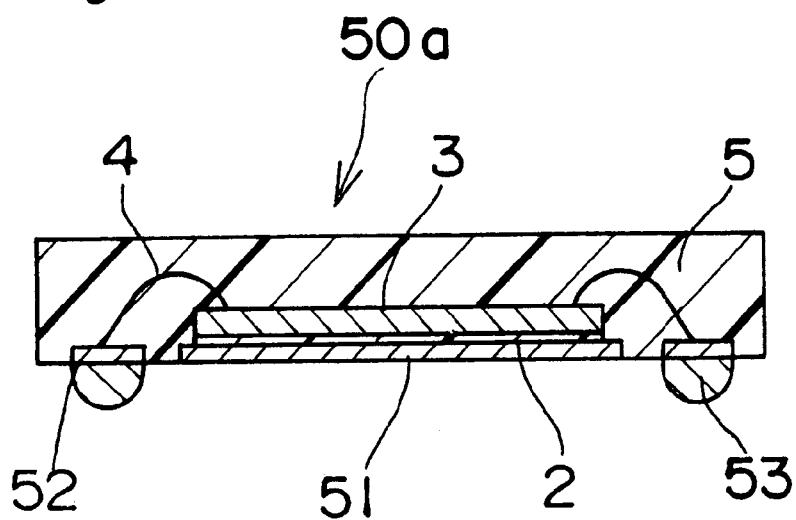
FIGS. 30A and 30B are sectional views showing the different prior art semiconductor devices, respectively.
Figure 30B:
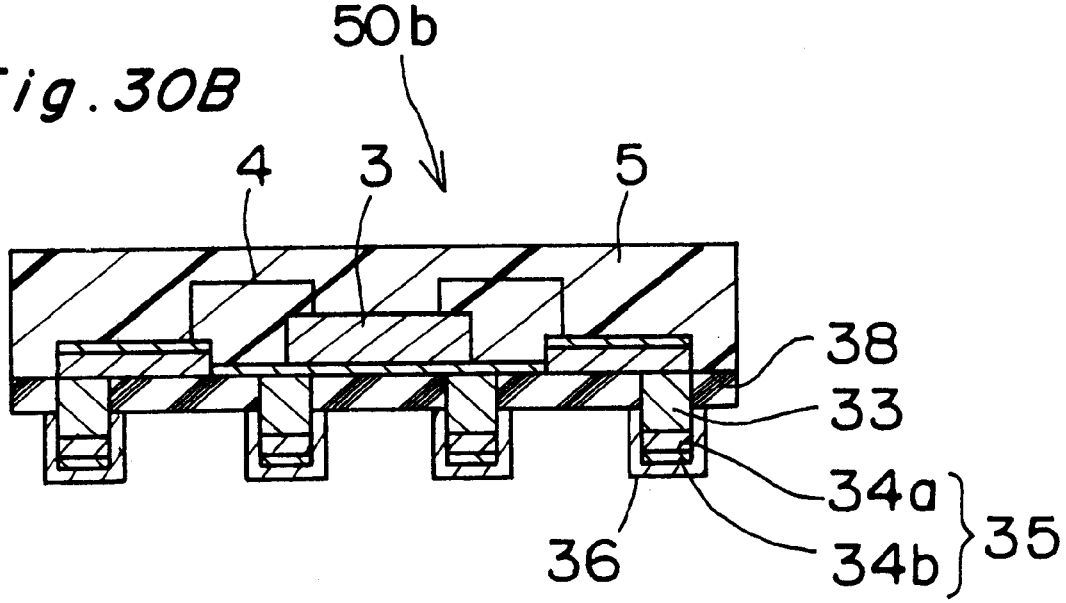
Figure 31A:
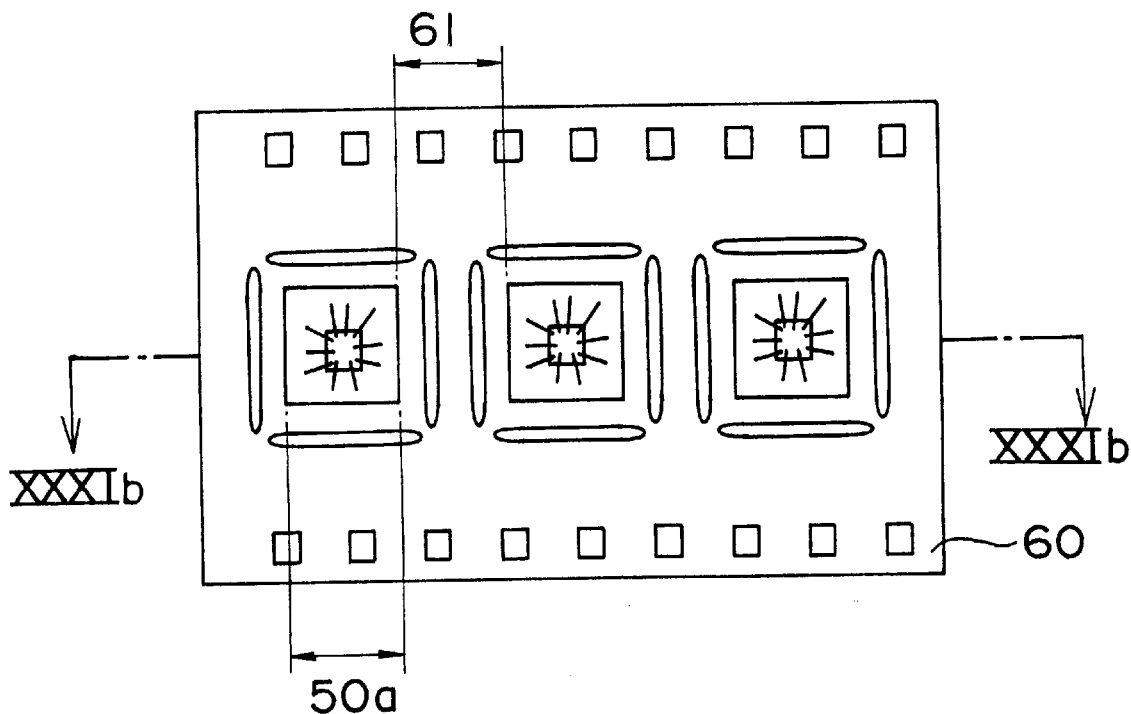
FIG. 31A is a top plan view showing the semiconductor chips mounted on the metallic base substrate during the manufacture of the prior art semiconductor device shown in FIG. 30A.
Figure 31B:
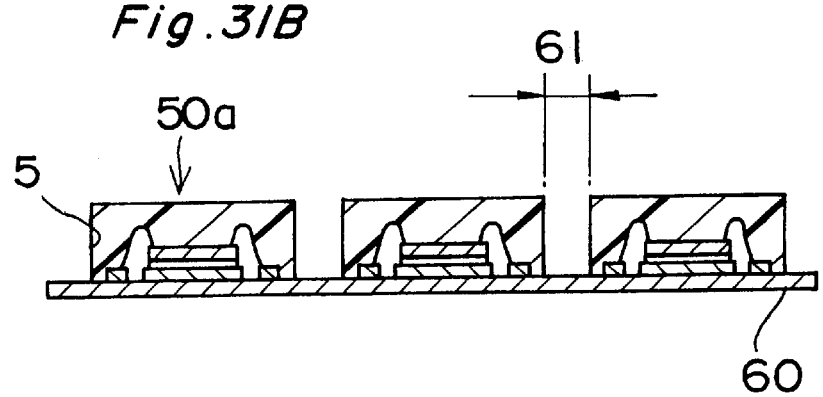
FIG. 31B is a cross-sectional view taken along the line XXXIb—XXXIb in FIG. 31A.
Figure 32:
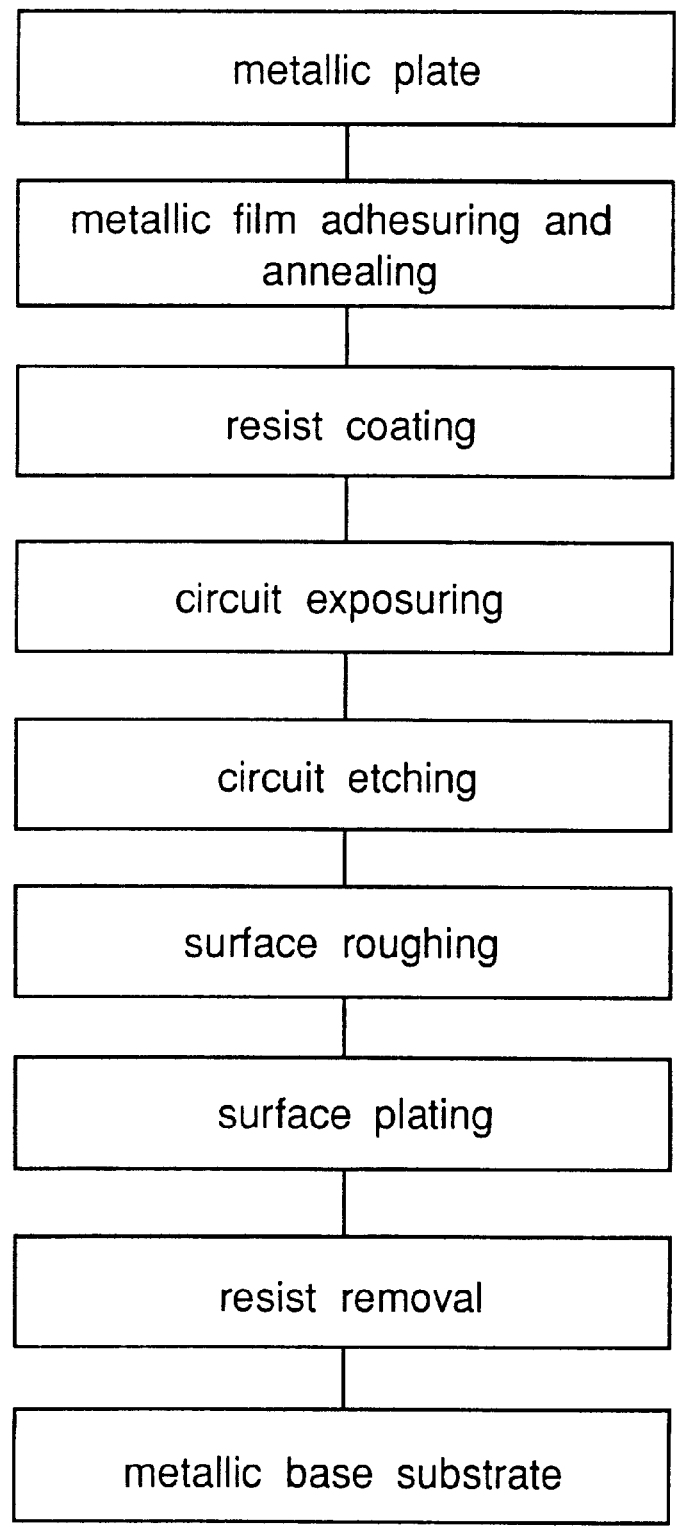
FIG. 32 is a flowchart showing the manufacture of the metallic base substrate for the prior art semiconductor device of FIG. 30A.

The semiconductor device 36 is fabricated in a manner substantially similar to the flowchart of FIG. 2, but the printing mask 10 of a configuration shown in FIGS. 29A and 29B is employed during the metal conductor printing step S10. The printing mask 10 shown in FIGS. 29A and 29B is formed with patterns of apertures 22 corresponding to the protruding wire pads 24 and patterns of apertures 26 corresponding to the protruding die pads 28. Using this printing mask 10 in combination with the planar jig 7b of the configuration described in connection with the fourth embodiment, the metallic paste layers 7 can be formed.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor device which comprises:
    a semiconductor chip mounted on a die pad, said die pad having first and second surfaces opposite to each other, and said semiconductor chip being mounted on the first surface;
    at least one electrode terminal spaced a distance from said die pad and electrically connected with said semiconductor chip through a corresponding wire, with said electrode terminal having third and fourth surfaces opposite to each other, and said wire being connected to said third surface; and
    a sealing resin enclosing the die pad and the electrode terminal on all sides except said second surface of the said die pad and said fourth surface of said electrode terminal, with a surface of the die pad opposite to the surface on which the second and fourth surfaces of the die pad and the electrode terminal, respectively, being exposed to an outside of the sealing resin;
    said die pad and said electrode terminal being formed of a sintered metal formed by sintering a paste containing a metal powder.

2. The semiconductor device according to claim 1, wherein the fourth surface of the electrode terminal is formed with an electroconductive protrusion.

3. The semiconductor device according to claim 1, wherein at least a portion of the second surface of the die pad is formed with an electroconductive protrusion.

4. The semiconductor device according to claim 1, wherein the die pad is made of a plurality of sintered metals and wherein said semiconductor chip is mounted on the plural sintered metals.

5. The semiconductor device according to claim 2, wherein said protrusion is a solder ball.

6. The semiconductor device according to claim 2, further comprising a protective layer formed so as to continuously cover a portion of the second surface of the die pad and a portion of the fourth surface of the electrode terminal or the second surface of the die pad adjacent the die pad to thereby prevent a moisture component from entering in the sealing resin.

7. The semiconductor device according to claim 1, wherein the number of the semiconductor chip is plural and the number of the die pad is correspondingly plural, both of the plural semiconductor chips and the correspondingly plural die pads being integrated together by the sealing resin.

8. A semiconductor device which comprises:
    a semiconductor chip mounted on a die pad, said die pad having first and second surfaces opposite to each other, and said semiconductor chip being mounted on the first surface;
    at least one electrode terminal spaced a distance from said die pad and electrically connected with said semiconductor chip through a corresponding wire, with said electrode terminal having third and fourth surfaces opposite to each other, and said wire being connected to said third surface; and
    a sealing resin enclosing the die pad and the electrode terminal, with a surface of the die pad opposite to the surface on which the second and fourth surfaces of the die pad and the electrode terminal, respectively, being exposed to an outside of the sealing resin;
    a protective layer formed so as to continuously cover a portion of the second surface of the die pad and a portion of the fourth surface of the electrode terminal to thereby prevent a moisture component from entering in the sealing resin;
    said die pad and said electrode terminal being formed of a sintered metal formed by sintering a paste containing a metal powder;
    wherein the fourth surface of the electrode terminal is formed with a first electroconductive protrusion.

9. The semiconductor device according to claim 8, wherein the second surface of the die pad is formed with a second electroconductive protrusion.

10. The semiconductor device according to claim 8, wherein the die pad is made of a plurality of sintered metals and wherein said semiconductor chip is mounted on the plural sintered metals.

11. The semiconductor device according to claim 8, wherein said first electroconductive protrusion is a solder ball.

12. A semiconductor device which comprises:

plural semiconductor chips mounted on respective plural die pads, said die pads having respective first and second surfaces opposite to each other, and said semiconductor chips being mounted respective of the first surfaces;

at least one electrode terminal spaced a distance from a respective one of said die pads and electrically connected with a respective one of said semiconductor chips through a corresponding wire, with said electrode terminal having third and fourth surfaces opposite to each other, and said wire being connected to said third surface; and a sealing resin enclosing the plural die pads and the electrode terminal, with a surface of the plural die pads opposite to the surface on which the second and fourth surfaces of the plural die pads and the electrode terminal, respectively, being exposed to an outside of the sealing resin;

said plural die pads and said electrode terminal being formed of a sintered metal formed by sintering a paste containing a metal powder;

wherein the plural semiconductor chips and the correspondingly plural die pads are covered by the sealing resin.

13. The semiconductor device according to claim 12, wherein the fourth surface of the electrode terminal is formed with an electroconductive protrusion.

14. The semiconductor device according to claim 12, wherein at least a portion of the second surfaces of the respective die pads is formed with an electroconductive protrusion.

15. The semiconductor device according to claim 12, wherein the respective die pads are made of a plurality of sintered metals and wherein said respective semiconductor chips are mounted on the plural sintered metals.

16. The semiconductor device according to claim 13, wherein said electroconductive protrusion is a solder ball.

17. The semiconductor device according to claim 13, further comprising a protective layer formed so as to continuously cover a portion of the second surface of the reactive die pads and a portion of the fourth surface of the electrode terminal or the second surface of the reactive die pads adjacent the die pad to thereby prevent a moisture component from entering in the sealing resin.

\* \* \* \* \*